United States Patent
Yamazaki et al.

(10) Patent No.: US 6,525,719 B2
(45) Date of Patent: Feb. 25, 2003

(54) DISPLAY DEVICE AND DRIVE CIRCUIT THEREFOR

(75) Inventors: Shunpei Yamazaki, Atsugi (JP); Jun Koyama, Atsugi (JP); Yutaka Shionoiri, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 09/946,364

(22) Filed: Sep. 6, 2001

(65) Prior Publication Data

US 2002/0008695 A1 Jan. 24, 2002

Related U.S. Application Data

(62) Division of application No. 09/115,841, filed on Jul. 15, 1998, now Pat. No. 6,292,183.

(30) Foreign Application Priority Data

Jul. 17, 1997 (JP) .............................................. 9-208570

(51) Int. Cl.[7] .................................................. G09G 5/00
(52) U.S. Cl. ......................................... 345/211; 349/92
(58) Field of Search .......................... 345/92, 112, 113, 345/114, 225; 307/200 B, 443

(56) References Cited

U.S. PATENT DOCUMENTS

| | | |
|---|---|---|
| 4,740,713 A | 4/1988 | Sakurai et al. .......... 307/200 B |
| 4,857,763 A | 8/1989 | Sakurai et al. .............. 307/443 |
| 5,105,187 A | 4/1992 | Plus et al. ................... 345/212 |
| 5,598,106 A | 1/1997 | Kawasaki et al. |
| 5,643,826 A | 7/1997 | Ohtani et al. |
| 5,648,277 A | 7/1997 | Zhang et al. |
| 5,952,791 A | 9/1999 | Watanabe et al. ........... 345/212 |
| 5,953,004 A | 9/1999 | Cho ........................... 345/212 |
| 6,037,924 A | 3/2000 | Koyama et al. ............ 345/212 |
| 6,014,124 A | 6/2000 | Plus et al. ................... 345/212 |
| 6,075,524 A | 6/2000 | Ruta ........................... 345/212 |

FOREIGN PATENT DOCUMENTS

| | | |
|---|---|---|
| JP | 07-038583 | 4/1995 |
| JP | 07-130652 | 5/1995 |
| JP | 07-135318 | 5/1995 |
| JP | 07-321334 | 12/1995 |
| JP | 08-078329 | 3/1996 |

*Primary Examiner*—Amare Mengistu
(74) *Attorney, Agent, or Firm*—Eric J. Robinson; Robinson Intellectual Property Law Office, P.C.

(57) ABSTRACT

In an active matrix liquid crystal display device, the driver of a gate signal line is provided with a low-supply-voltage drive section and a high-supply-voltage drive section. A level shifter circuit in the high-supply-voltage drive section is made up of two CMOS circuits, to which a supply voltage Vdd2 (high-voltage power supply) is applied. Also, to two n-channel TFTs Tr3 and Tr7 in the level shifter circuit is applied a bias voltage Vdd1 (low-voltage power supply) which is a supply voltage different from the above supply voltage. This structure can prevent a high load from being exerted on only one n-channel TFT, thereby being capable of making the withstand voltage high.

15 Claims, 19 Drawing Sheets

TO GATE SIGNAL LINES

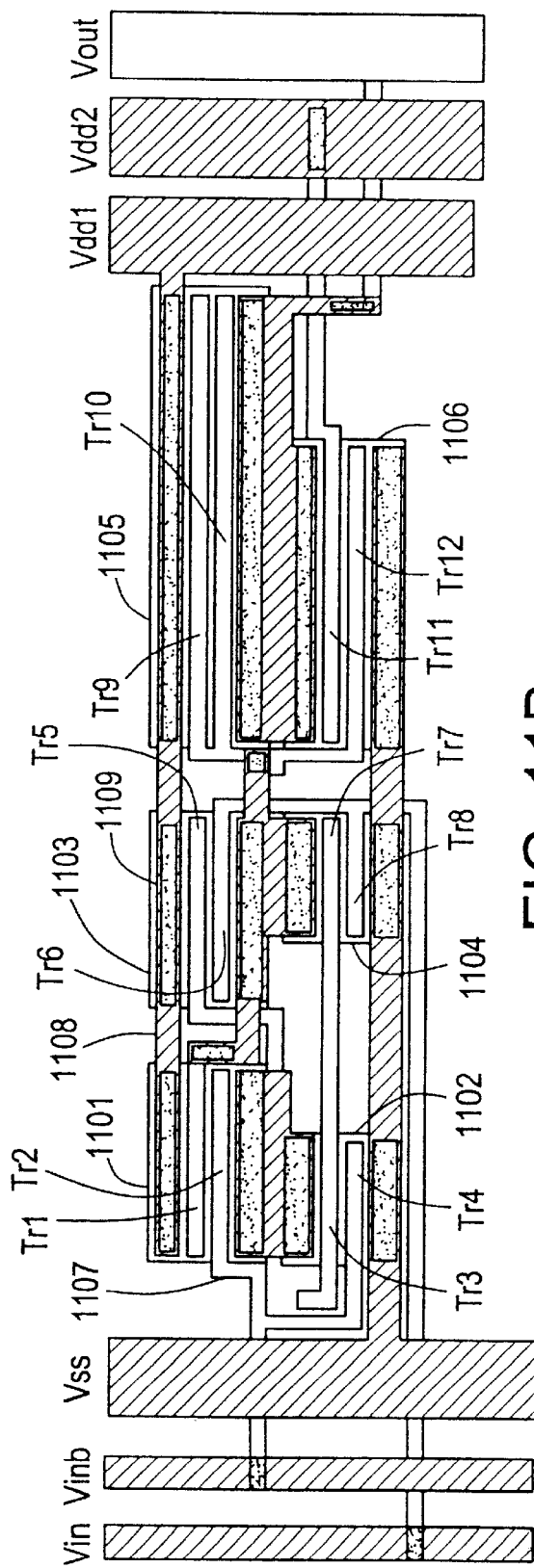
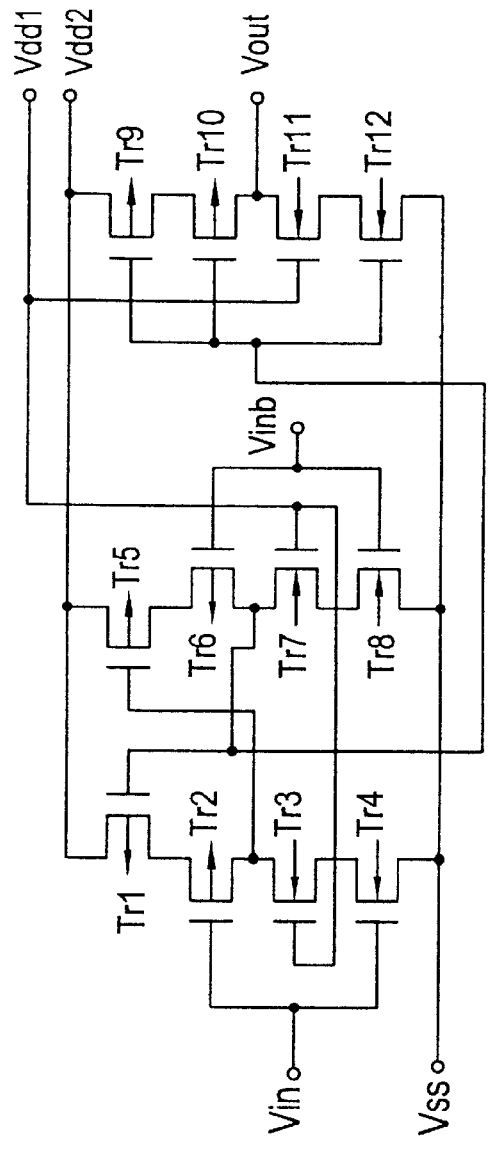
FIG. 11A
FIG. 11B

CMOS CIRCUIT | PIXEL MATRIX CIRCUIT

CMOS CIRCUIT          PIXEL MATRIX CIRCUIT

DISPLAY DEVICE AND DRIVE CIRCUIT THEREFOR

Divisional of prior application Ser. No. 09/115,841 filed Jul. 15, 1998 now U.S. Pat. No. 6,292,183.

BACKGROUND OF THE INVENTION

1. Field of the Invention

The present invention relates to a drive circuit for a display device that displays an image by driving pixel TFTs arranged in a matrix. In particular, the present invention relates to an increase in the withstand voltage of the drive circuit of this type. Also, the present invention relates to a liquid-crystal display device and a liquid-crystal projector each having the drive circuit of this type.

2. Description of the Relate Art

In recent years, a technique by which a semiconductor device having a semiconductor thin film formed on an inexpensive glass substrate, for example, a thin-film transistor (TFT) is fabricated has been rapidly developed. This is because a demand for active matrix liquid crystal display devices has been increased.

The active matrix liquid crystal display device is designed in such a manner that a TFT is disposed in each of several-ten to several-million pixel regions arranged in a matrix, and charges going in and out of the respective pixel electrodes are controlled by the switching function of the TFTs.

FIGS. 1A and 1B show the structure of a conventional active matrix liquid crystal display device. A shift register and a buffer circuit are generally called "peripheral drive circuit", and in recent years, they are formed integrally with an active matrix circuit on the same substrate.

In the active matrix circuit, there are thin film transistors using amorphous silicon formed on the glass substrate.

Also, there has been known a structure in which quartz is used as the substrate, and the thin film transistors are produced with polycrystal silicon films. In this case, the peripheral drive circuit and the active matrix circuit are structured by the thin film transistors formed on the quartz substrate.

Also, there has been known a technique by which a thin film transistor using a crystalline silicon film is produced on the glass substrate through a process such as laser annealing. The use of this technique makes it possible to integrate the active matrix circuit and the peripheral drive circuit on the glass substrate.

In the structure shown in FIGS. 1A and 1B, an image signal which is supplied to an image signal line is selected at a timing indicated by symbol (B) according to a signal from a shift register circuit (horizontal scanning shift register) in a source line side drive circuit. Then, a predetermined image signal is supplied to a corresponding source signal line.

The image signal supplied to the source signal line is selected by a thin film transistor of each pixel and written in a predetermined pixel electrode.

The thin film transistor of each pixel is operated according to a selected signal supplied to the thin film transistor from a shift register (vertical scanning shift register) in a gate line side drive circuit through a gate signal line.

This operation is sequentially repeated at appropriate timing according to the signals from the shift register in the source line side drive circuit and the signals from the shift register in the gate line side drive circuit, thereby allowing information to be sequentially written in each pixel disposed in a matrix.

After image information for one screen has been written in the respective pixels, image information for a succeeding screen is written. In this way, images are sequentially displayed. Normally, writing of information for one screen is conducted 30 or 60 times per one minute.

In recent years, display capacity has been increased, and display resolution has been highly fined with a rapid increase in information amount to be dealt with. Examples of the display resolution of a computer generally employed are indicated below with the number of pixels and standard names.

The number of pixels
(lateral×longitudinal): Standard name

| | |
|---|---|
| 640 × 400 | :EGA |
| 640 × 480 | :VGA |
| 800 × 600 | :SVGA |
| 1024 × 768 | :XGA |
| 1280 × 1024 | :SXGA |

Also, in recent years, likewise in the field of personal computers, because software that conducts plural displays different in character on the display has spread, the display device is being shifted from the display device adaptive to VGA or SVGA standard to the display device adaptive to XGA or SXGA standard which is higher in display resolution.

Further, the above liquid crystal display device high in display resolution is being employed for display of a television signal in addition to display of a data signal in a personal computer.

Under the above circumstances, in recent years, projection type display devices using an active matrix liquid crystal panel, that is, projectors are rapidly being diffused on the market. The liquid crystal projector is designed to irradiate an intense light onto a liquid crystal panel and transcribe an image on a screen through a lens. The liquid crystal projector makes it possible to transcribe an image onto a screen of 100 or 200 inches due to its characteristic.

Also, the liquid crystal projector is excellent in color reproducibility more than the projector using a CRT, and also small in size, light in weight and low in power consumption.

As described above, in order to realize a liquid crystal panel or liquid crystal projector large in screen, high in fineness and high in resolution, the number of pixel TFTs to be used must be increased as much. In this case, a higher voltage than the conventional one must be applied to the gate signal line so that a desired voltage is applied to the gates of all TFTs on a selected row in the active matrix circuit.

FIG. 2 shows an example of a gate signal line side drive circuit (driver) in a liquid crystal display device which requires the application of a high voltage to the gate signal line. Reference numeral 201 denotes a shift register circuit; 202 is an invertor; 203 is a level shifter; and 204 is an invertor at a final stage. The invertor 204 at the final stage is connected to a corresponding gate signal line.

The shift register circuit is made up of a plurality of flip flop circuits. The shift register starts at a predetermined timing upon the input of a start pulse signal which is inputted to the shift register circuit. Also, a predetermined clock signal is inputted to the shift register. The shift register circuit has a function to supply a signal that determines an operation timing to a circuit corresponding to the gate signal line.

A signal from the shift register 201 is outputted to the invertor 202. The invertor 202 inverts the above inputted signal to output it to the level shifter 203.

An input signal of the level shifter 203 passes through the level shifter 203, thereby increasing in voltage, and then outputted to the invertor 204 at the final stage which is connected to the gate signal line. Thereafter, a signal inverted by the final-stage invertor 204 is outputted to the gate signal line.

In this example, two power supplies for the driver are required. In other words, a low-voltage power supply is used for the shift register 201 and the invertor 202, and a high-voltage power supply is used for the level shifter and the final-stage invertor 204, thus supplying a high-voltage signal to the gate signal line.

An example of circuits of the level shifter 203 and the invertor 204 conventionally used is shown in FIGS. 3A and 3B. A supply voltage Vddh of the level shifter 203 and the invertor 204 is 16 V. In FIG. 3B, in order to distinguish two n-channel TFTs for convenience of description, those TFTs are indicated by reference numeral 301 and 302, respectively.

The level shifter 203 is designed in such a manner that an inversion signal obtained by raising the voltage of the signal inputted to Vin is outputted from Vout. The signal outputted from Vout of the level shifter 203 is inputted to Vin of the final-stage invertor 204. The signal inputted to the final-stage invertor 204 is inverted and then outputted to a corresponding gate signal line from Vout.

FIG. 4 shows the results of simulating a change in the voltage of the final-stage invertor 204. In FIG. 4, symbol ○ denotes supply voltage Vddh (=16V), symbol Δ is an input signal Vin, symbol ▽ is an output signal Vout, and symbol □ is a voltage Vx between the source and drain of two n-channel TFTs as shown in FIG. 3B. In FIG. 4, the axis of ordinates indicates the voltage values (V) of Vddh, Vout and Vx whereas the axis of abscissas indicates the voltage value (V) of Vin.

Also, FIG. 5 shows a waveform of the signal outputted from the final-stage invertor 204 to the gate signal line. In FIG. 5, the axis of ordinates indicates a voltage value (V), and the axis of abscissas indicates a time ($\mu$s).

Upon studying the simulation result shown in FIG. 4, it is understood that when the input signal Vin is low, most of the supply voltage is applied to the n-channel TFT 301 because Vx is extremely smaller than Vout, and little voltage is applied to the n-channel TFT 302 (FIGS. 3A and 3B).

Hence, a load exerted on the n-channel TFT 301 is large, to thereby deteriorate the n-channel TFT 301.

This is caused by the phenomenon that in the case where a high voltage is applied to the TFT, the threshold value of the TFT, etc., fluctuates for accelerated hot carriers which are generated in a drain region and have a high energy, thereby inducing a change as a time elapses.

There has been known that the deterioration of the TFT due to the hot carriers is the largest when a gate-source voltage is close to 2V.

The above deterioration of the n-channel TFT 301 causes the supply of a signal to the gate signal line to be cut off, as a result of which there occurs display defects such as a line defect, thereby degrading the image quality.

Also, in the above active matrix liquid crystal display device, drive of liquid crystal due to TN mode (twist nematic mode) is generally frequently employed. In the drive of liquid crystal due to the TN mode, nematic liquid crystal is orientated so as to be twisted by 90°. Also, the twisted state is released by the application of a voltage to change an optical state. In the interior of the TN liquid crystal, such a phenomenon that the polarization axis of linear polarization rotates is used so that a desired image can be obtained by the linear polarization that passes through a pair of polarizing plates.

In the TN mode, liquid crystal can be driven at a low voltage such as several volts, and a load exerted on a peripheral drive circuit that drives the respective TFTs corresponding to several million pixels one by one is also relatively low. However, the TN mode suffers from a lot of defects such that the angle of view is narrow, a response speed is low, etc.

Under such existing circumstances, novel liquid crystal drive modes have been researched. In the novel modes, there are an electric field controlled birefringence (ECB) mode, a guest host mode, etc. In those modes, there is a mode that requires that a voltage higher than that in the TN mode is applied to liquid crystal. Likewise, this mode uses means for raising an output voltage from the invertor 202 by the level shifter 203 to output it to the final-stage invertor 204.

In this way, a case of applying a high voltage for driving liquid crystal also suffers from a problem such as the above-described deterioration of the TFT due to the hot carriers.

SUMMARY OF THE INVENTION

The present invention has been made to solve the above problem, and therefore an object of the present invention is to provide a drive circuit that prevents the deterioration of a TFT in a CMOS circuit on a high-voltage side, makes a withstand voltage high, and increases a drive margin in the case where two voltages of a high voltage and a low voltage are provided for a supply voltage to a peripheral drive circuit and a high voltage is needed to be applied to a gate signal line.

Another object of the present invention is to provide a liquid crystal display device using the above drive circuit.

In order to achieve the above objects, according to one aspect of the present invention, there is provided a drive circuit for a display device comprising:

three power supplies Vdd1, Vdd2 and Vss; and a plurality of CMOS circuits formed on an insulating substrate, each of said plurality of CMOS circuits including: an output terminal; an input terminal; at least one p-channel TFT connected between said power supply Vdd2 and said output terminal; and an n-channel TFT having two gate electrodes connected between said output terminal and said Vss, wherein a relation of said Vdd2>said Vdd1>said Vss is satisfied, and one of said two gate electrodes of said n-channel TFT which is close to said p-channel TFT is connected to said Vdd1, and the other gate electrode is connected to said input terminal. The above object of the present invention is achieved by the above-mentioned drive circuit.

The drive circuit may include a level shifter and an invertor or a buffer having the CMOS circuit.

The n-channel TFT having the two gate electrodes is formed on the same semiconductor layer.

The p-channel TFT includes two gate electrodes.

According to another aspect of the present invention, there is provided a display device comprising:

an insulating substrate;

a plurality of pixel TFTs formed on an insulating substrate;

a drive circuit formed on the insulating substrate for driving the plurality of pixel TFTs; and a display medium an optical response of which is controlled by the plurality of pixel TFT's, wherein the drive circuit comprises: three power supplies Vdd1, Vdd2 and Vss; and a plurality of CMOS circuits formed on the insulating substrate, each of the plurality of CMOS circuits including: an output terminal; an input terminal; at least one p-channel TFT connected between the power supply Vdd2 and the output terminal; and an n-channel TFT having two gate electrodes connected between the output terminal and the Vss; and wherein a relation of the Vdd2>the Vdd1>the Vss is satisfied, and one of the two gate electrodes of the n-channel TFT which is close to the p-channel TFT is connected to the Vdd1, and the other gate electrode is connected to the input terminal. The above object of the present invention is achieved by the above-mentioned display device.

The display device may include a level shifter and an invertor having the CMOS circuit.

The n-channel TFT having the two gate electrodes may be formed on the same semiconductor layer.

The p-channel TFT may include two gate electrodes.

The display medium may comprise liquid crystal.

The liquid crystal may comprise anti-ferroelectric liquid crystal.

According to another aspect of the present invention, there is provided a drive circuit for a display device, comprising:

two power supplies Vdd and Vss; and a plurality of CMOS circuits formed on an insulating substrate, each of the plurality of CMOS circuits including: an output terminal; an input terminal; at least one p-channel enhancement TFT connected between the Vdd and the output terminal; an n-channel enhancement TFT at least one of a source and a drain of which is connected to the Vss; and an n-channel depletion TFT connected between the other of the source and the drain of the n-channel enhancement TFT and the output terminal, wherein a relation of the Vdd>the Vss is satisfied, and a gate electrode of the n-channel depletion TFT is connected to a node between the n-channel depletion TFT and the n-channel enhancement TFT.

The drive circuit may include a level shifter and an invertor having the CMOS circuit.

The n-channel enhancement TFT and the n-channel depletion TFT may be formed on the same semiconductor layer.

The drive circuit may further include a p-channel enhancement TFT between the p-channel enhancement TFT and the output terminal.

According to still another aspect of the present invention, there is provided a display device, comprising:

an insulating substrate;

a plurality of pixel TFTs formed on an insulating substrate;

a drive circuit for driving the plurality of pixel TFTs; and a liquid crystal layer an optical response of which is controlled by the plurality of pixel TFTs, wherein the drive circuit comprises: two power supplies Vdd and Vss; and a plurality of CMOS circuits formed on the insulating substrate, each of said plurality of CMOS circuits-including: an output terminal; an input terminal; at least one p-channel enhancement TFT connected between the Vdd and the output terminal; an n-channel enhancement TFT at least one of a source and a drain of which is connected to the Vss; and an n-channel depletion TFT connected between the other of the source and the drain of the n-channel enhancement TFT and the output terminal, and wherein a relation of the Vdd>the Vss is satisfied, and a gate electrode of the n-channel depletion TFT is connected to a node between the n-channel depletion TFT and the n-channel enhancement TFT.

The drive circuit may include a level shifter and an invertor having the CMOS circuit.

The at least one n-channel enhancement TFT and the n-channel depletion TFT may be formed on the same semiconductor layer.

The drive circuit may further include a p-channel enhancement TFT between the p-channel enhancement TFT and the output terminal.

According to yet still another aspect of the present invention, there is provided a drive circuit for a display device, comprising:

three power supplies Vdd1, Vdd2 and Vss;

a low-supply-voltage drive section; and a high-supply-voltage drive section, wherein a relation of the Vdd2>the Vdd1>the Vss is satisfied;

wherein the high-supply-voltage drive section comprises: a plurality of CMOS circuits formed on an insulating substrate, each of the plurality of CMOS circuits including: an output terminal; an input terminal; at least one p-channel TFT connected between the power supplies Vdd2 and the output terminal; and an n-channel TFT having two gate electrodes connected between the output terminal and the Vss; and wherein one of said two gate electrodes of the n-channel TFT which is close to said p-channel TFT is connected to the Vdd1, and the other gate electrode is connected to the input terminal, and the Vdd1 is applied to a power supply of the low-supply-voltage drive section.

BRIEF DESCRIPTION OF THE DRAWINGS

FIGS. 11A and 11B are circuit diagrams showing a level shifter and a final-stage invertor according to the second embodiment;

DETAILED DESCRIPTION OF THE PREFERRED EMBODIMENTS

A liquid crystal display device according to the present invention includes a low-supply-voltage drive section and a high-supply-voltage drive section in a drive circuit on a gate signal line side thereof. According to the present invention, to make the withstand voltage of a circuit in the high-supply-voltage drive section higher can be realized.

[First Embodiment]

In this embodiment, a driver circuit on a gate signal line side which can realize higher withstand voltage will be described on the basis of simulation results.

Figure 6:
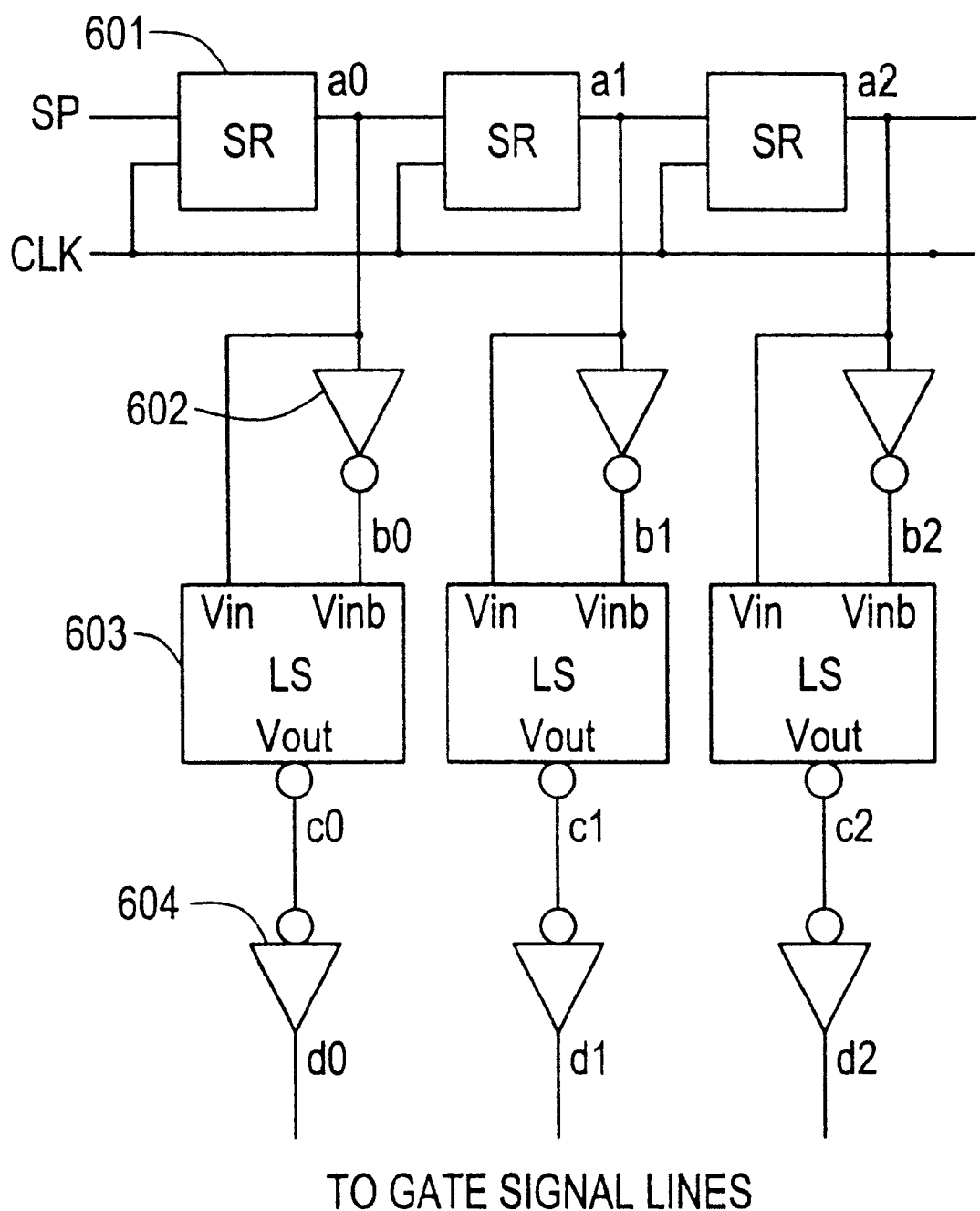
FIG. 6 is a schematic diagram showing a gate signal line side drive circuit in an active matrix liquid crystal display device according to the first embodiment.

FIG. 6 shows an example of a gate signal line side drive circuit (driver) in a liquid crystal display device which requires the application of a high voltage to a gate signal line. Reference numeral 601 denotes a shift register circuit; 602 is an invertor; 603 is a level shifter; and 604 is an invertor at a final stage. The final-stage invertor 604 is connected to a corresponding gate signal line. In this structure, an analog buffer circuit, an analog switch circuit or other circuits are employed as occasions demand. Also, in this. embodiment, although the shift register circuit is made up of only three flip flop circuits for convenience of the description, the number of flip flop circuits are varied appropriately according to the number of pixels. Further, in the drive circuit of this embodiment, three power supplies Vdd1, Vdd2 and GND (Vdd2>Vdd1>GND) are used. The Vdd1 is used as a power supply for circuits of from the shift register 601 to the invertor 602. This section is called "low-supply-voltage drive section". The Vdd2 is used as a power supply for circuits of from the level shifter 603 to the final-stage invertor. This section is called "high-supply-voltage drive section".

The shift register circuit 601 is made up of a plurality of flip flop circuits. "SP" which is inputted to the shift register circuit 601 is an abridgment of "start pulse", and upon input of this start pulse signal, the shift register starts to operate at predetermined timing. Also, "CLK" which is inputted to the shift register circuit 601 is an abridgment of "clock signal", and a predetermined clock signal is inputted to the shift register. The shift register circuit has a function to supply a signal that determines operation timing to a circuit corresponding to the gate signal line.

A signal from the shift register 601 is outputted to the invertor 602. The invertor 602 inverts the inputted signal to output it to the level shifter 603.

The level shifter 603 has two inputs Vin and Vinb, and in this embodiment, the signal from the shift register circuit 601 is inputted to Vin, and its inversion signal is inputted to Vinb.

An input signal of the level shifter 603 passes through the level shifter 603, to thereby increase in voltage, and is then outputted to the final-stage invertor 604. Thereafter, a signal inverted by the final-stage invertor 604 is outputted to the gate signal line.

Figure 7A:
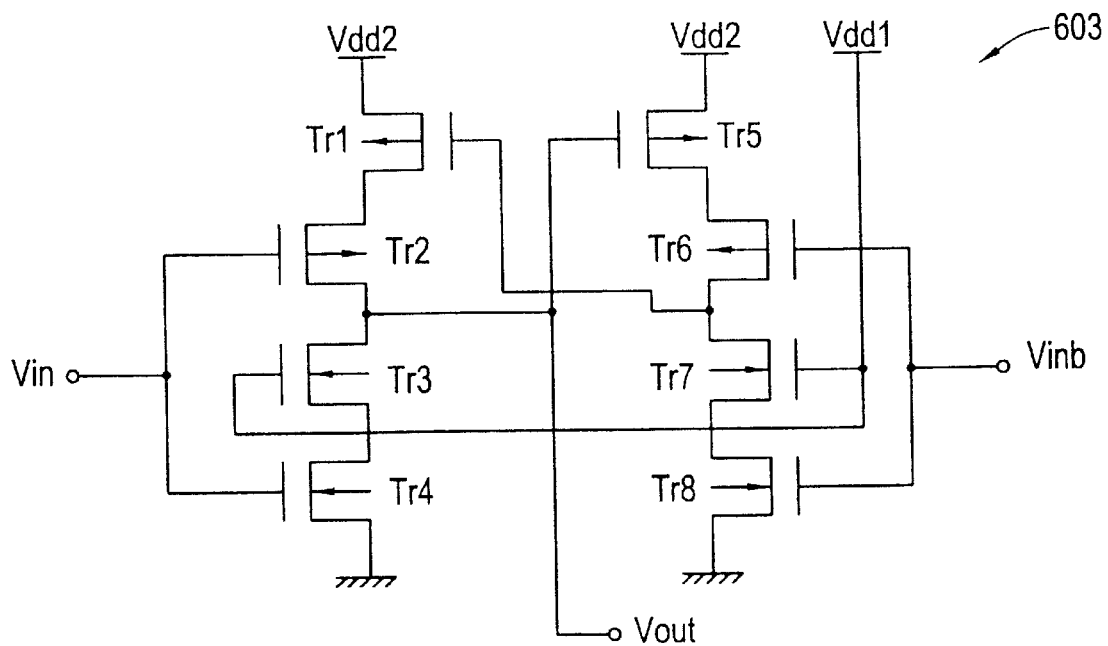
FIGS. 7A and 7B are circuit diagrams showing a level shifter and a final-stage invertor according to the first embodiment.
Figure 7B:
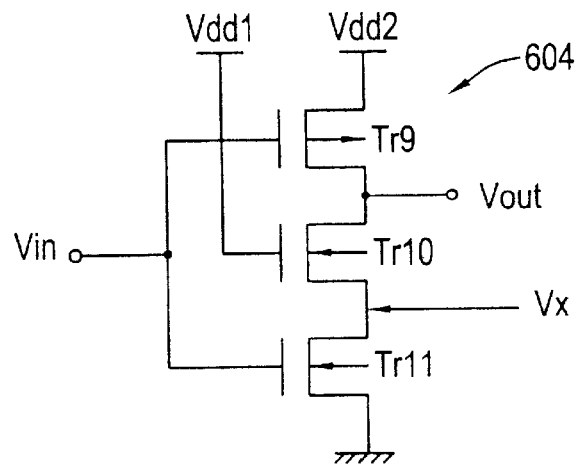

FIGS. 7A and 7B show a driver circuit at the high-voltage side of the gate signal line side. FIG. 7A shows a circuit of the level shifter 603, and FIG. 6B shows a circuit of the final-stage invertor 604 which is connected to the gate signal line. In FIGS. 6A and 6B, the respective TFTs are indicated by symbols Tr1 to Tr11.

In this embodiment, a description will be given of only the level shifter circuit and the final-stage invertor circuit. As occasions demand, a shift register circuit, an analog buffer circuit and so on are used for the gate signal line side driver.

Referring to FIG. 7A, the level shifter 603 of this embodiment is made up of 8 enhancement TFTs, to which a supply voltage Vdd2 (high-voltage power supply) is applied. Also, two n-channel TFTs Tr3 and Tr7 of the level shifter 603 is applied with a bias voltage Vdd1 (low-voltage power supply) that is a supply voltage different from the above supply voltage. Further, Tr4 and Tr8 are connected to GND. In this embodiment, Vdd1=10V, and Vdd2=16V.

An input signal inputted from the shift register circuit 601 to an input terminal Vin of the level shifter 603 is such that when a signal Hi is inputted to Vin, its inversion signal Lo is inputted to Vinb. When the signal Hi is inputted to Vin of the level shifter 603, a signal Lo is outputted from the output terminal Vout connected to the signal output end. Also, when the signal Lo is inputted to Vin of the level shifter 603, the signal Hi whose voltage level is shifted to 16V is outputted from the output Vout. In other words, in the level shifter 603, the level of the signal inputted to Vin is inverted and shifted to a high potential, and then send out to the final-stage invertor 604.

FIG. 7B shows a circuit of the final-stage invertor 604 which is connected to the gate signal line. The invertor 604 is made of a CMOS circuit including a single-gate p-channel enhancement TFT Tr9 and double-gate n-channel enhancement TFTs Tr10 and Tr11. The Tr10 and Tr11 are formed of the same semiconductor active layer. That is, Tr10 and Tr11 is structured by forming two gate electrodes on the same semiconductor active layer.

The supply voltage Vdd2 (high-voltage power supply) is also applied to the invertor 604, and the n-channel TFT Tr10 is applied with a bias voltage Vdd1 (low-voltage power supply) that is a supply voltage different from the above supply voltage. Further, Tr12 is connected to GND. In this embodiment, Vdd1=10V, and Vdd2=16V as in the above level shifter 603.

The output signal Vout from the level shifter 603 shown in FIG. 7A is inputted to the input terminal Vin of the invertor circuit shown in FIG. 7B, and its inversion signal is outputted from the output terminal Vout connected to the signal output end, and then outputted to the gate signal line.

Figure 8:
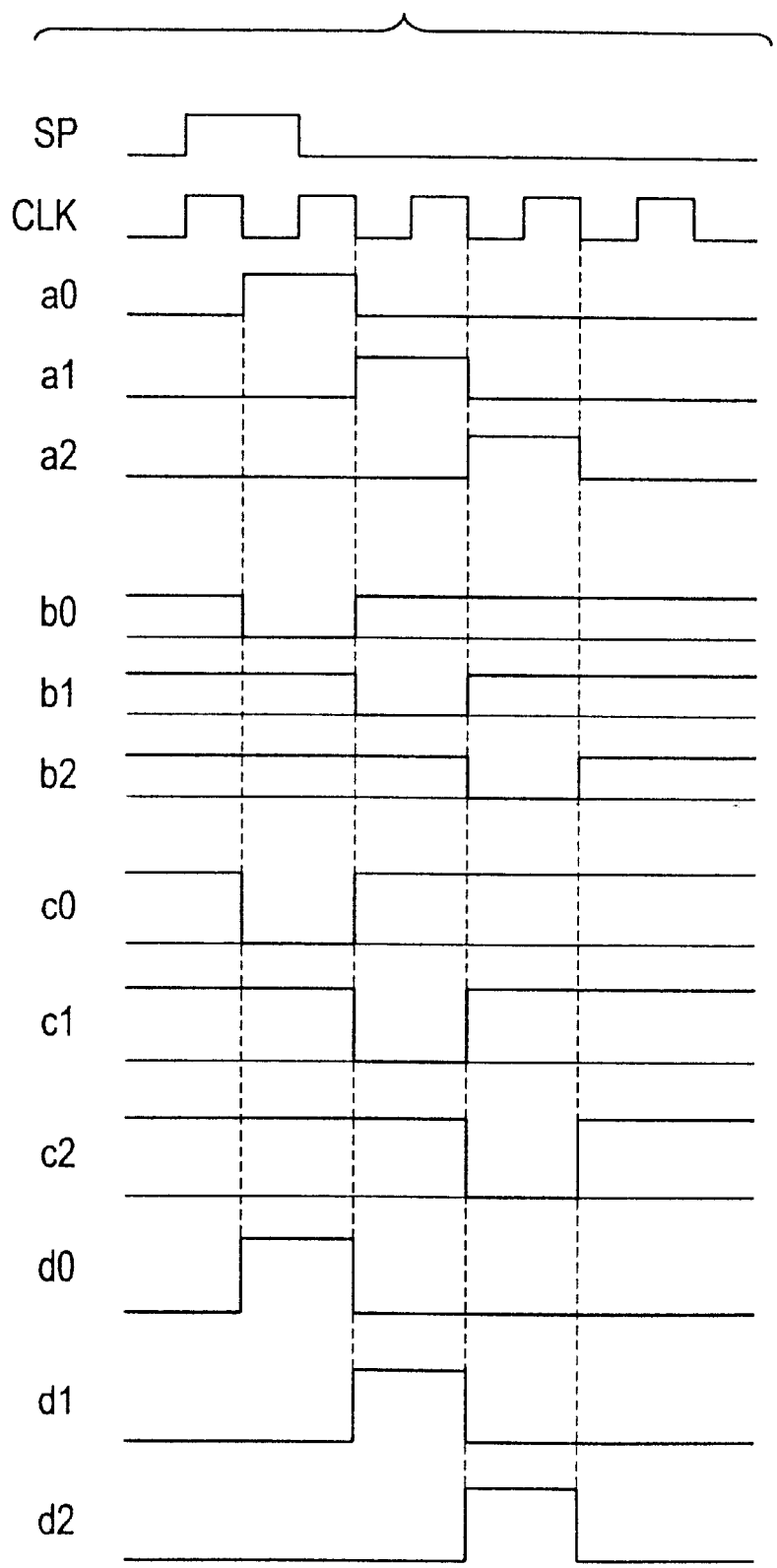
FIG. 8 is a timing chart showing operations of a shift register, the level shifter and the final-stage invertor according to the first embodiment.

Now, the operation of the shift register circuit 601, the invertor 602, the level shifter 603 and the final-stage invertor 604 will be described with reference to a timing chart shown in FIG. 8.

It is assumed that the signals sent out from the shift register circuit 601 are a0 to a2, the signals sent out from the invertor 602 are b0 to b2, the signals sent out from the level shifter 603 are c0 to c2, and the signals sent out from the final-stage invertor 604 to corresponding signal lines are d0 to d2.

The signal a0 sent out from the shift register circuit 601 is branched into two signals one of which is inputted to Vin of the level shifter 603, and the other of which is inverted by the invertor 602 (b0) and then inputted to Vinb of the level shifter 603. Thereafter, the signal c0 whose level is shifted to a high potential is outputted from the level shifter 603. Then, the output c0 is inputted to the final-stage invertor 604, and its inversion signal d0 is outputted to a corresponding gate signal line. Hence, the level shifter 603 is designed to output a negative signal at a timing when the signal is supplied to the gate signal line.

The signal sent out to the gate signal line and the signal (not shown) supplied by the source-side driver allow the pixel TFT to be switched, thereby being capable of lightening or putting out a desired pixel.

Figure 9:
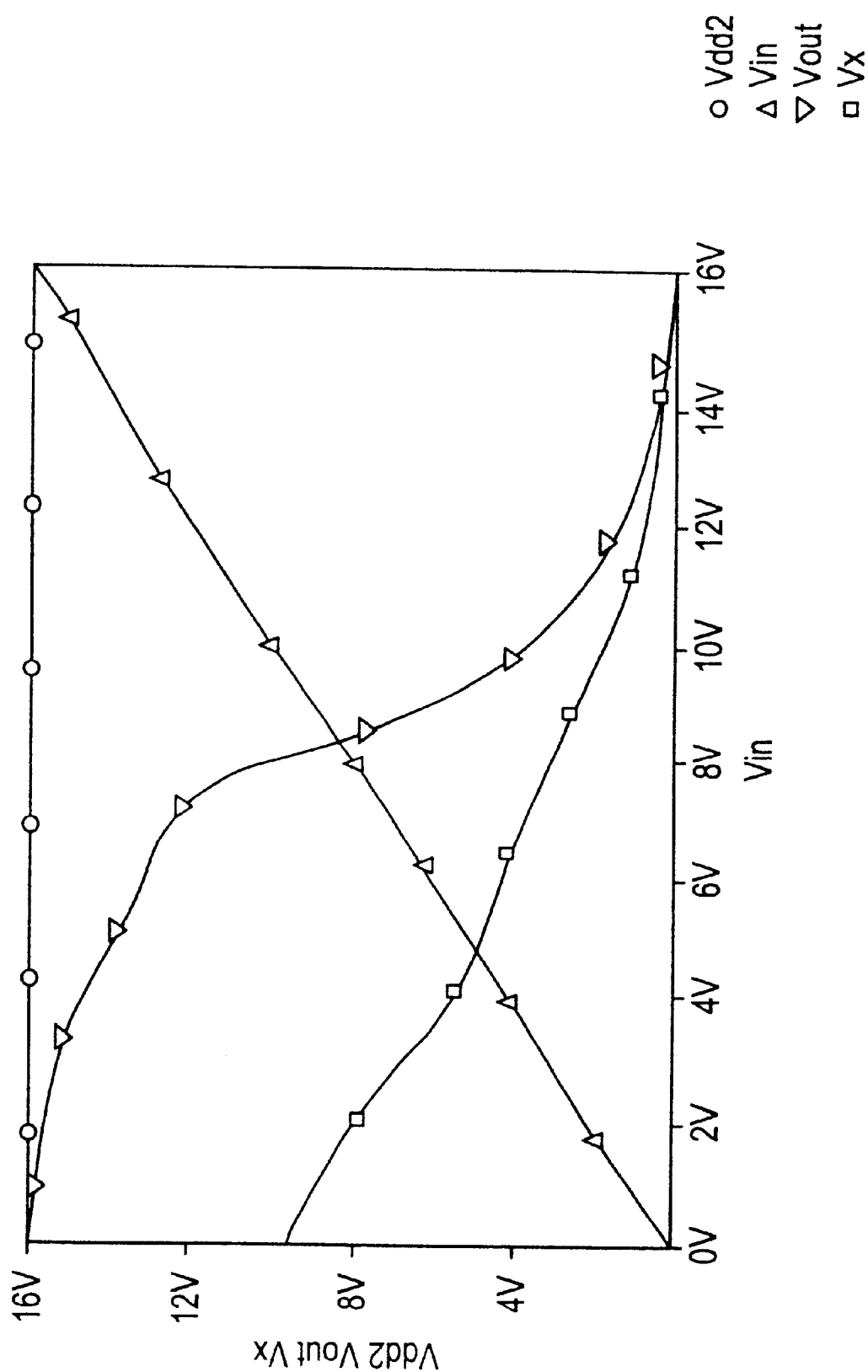
FIG. 9 is a diagram showing the simulation results of a change of voltage in the final-stage invertor according to the first embodiment.

FIG. 9 shows the simulation results of a change of voltage in the invertor according to this embodiment. In FIG. 9, symbol ○ denotes supply voltage Vdd2 (=16V), symbol Δ is an input signal Vin, symbol ▽ is an output signal Vout, and symbol □ is a voltage Vx between the source and drain of two n-channel TFTs as shown in FIG. 7B. In FIGS. 7A and 7B, the axis of ordinates indicates the voltage values of Vdd2, Vout and Vx whereas the axis of abscissas indicates the voltage value of Vin.

Upon study of the simulation results, it is understood that the voltage Vx between the source and drain of two n-channel TFTs Tr10 and Tr11 is nearly the half value of the output Vout regardless of the value of the input Vin. In other words, it is understood that a voltage is substantially uniformly applied to those two n-channel TFTs Tr10 and Tr11. Therefore, even in the case where the supply voltage is relatively high to 16V, a load is substantially uniformly to those two n-channel TFTs Tr10 and Tr11, and there is no case in which a high load is applied to only one of those TFTs.

Figure 10:
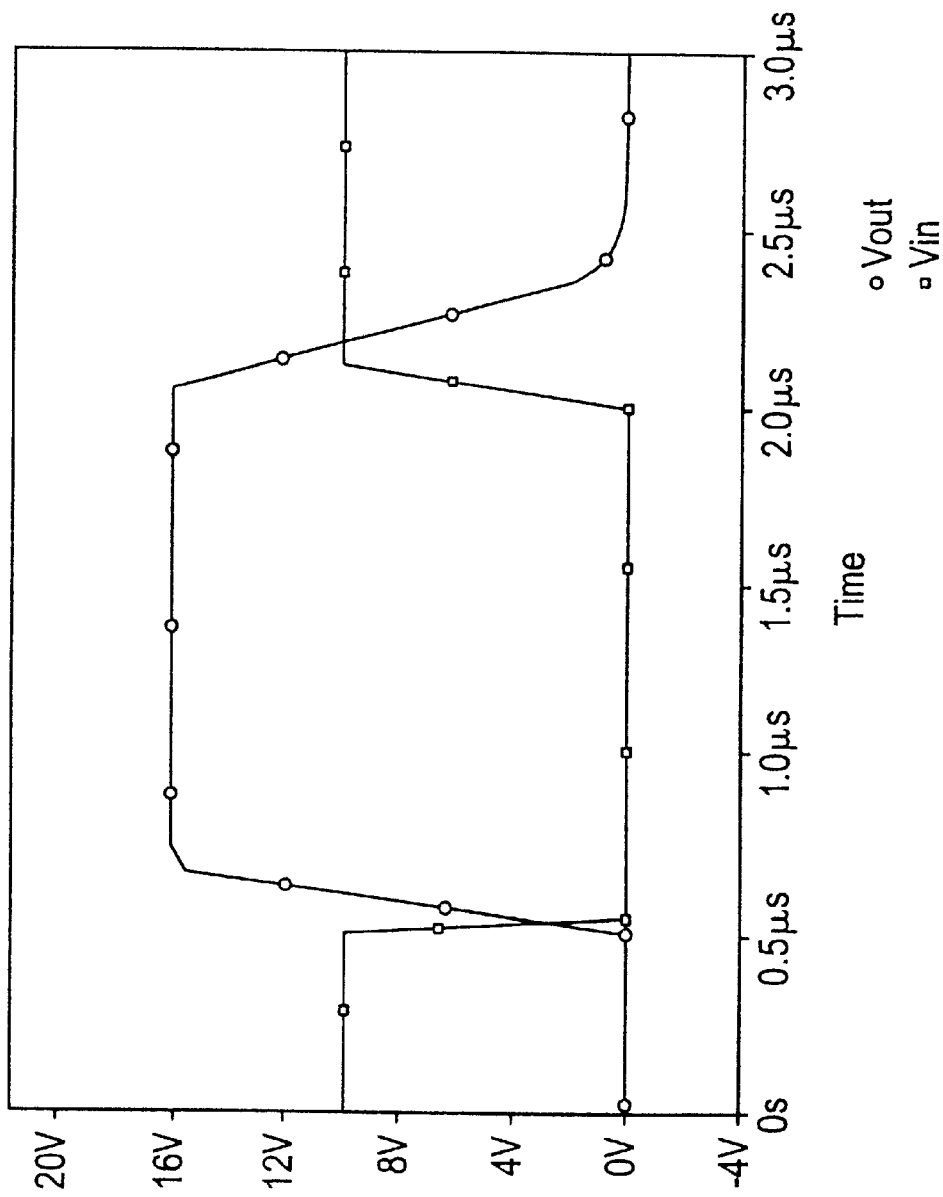
FIG. 10 is a diagram showing an output waveform of the invertor according to the first embodiment.

FIG. 10 shows a waveform of the output Vout from the final-stage invertor 604 to the gate signal line according to this embodiment. In FIG. 10, symbol ○ denotes the output Vout, and symbol □ is the input Vin. In FIG. 8, the axis of ordinates indicates a voltage (V) whereas the axis of abscissas indicates a time ($\mu$s).

Figure 1A:
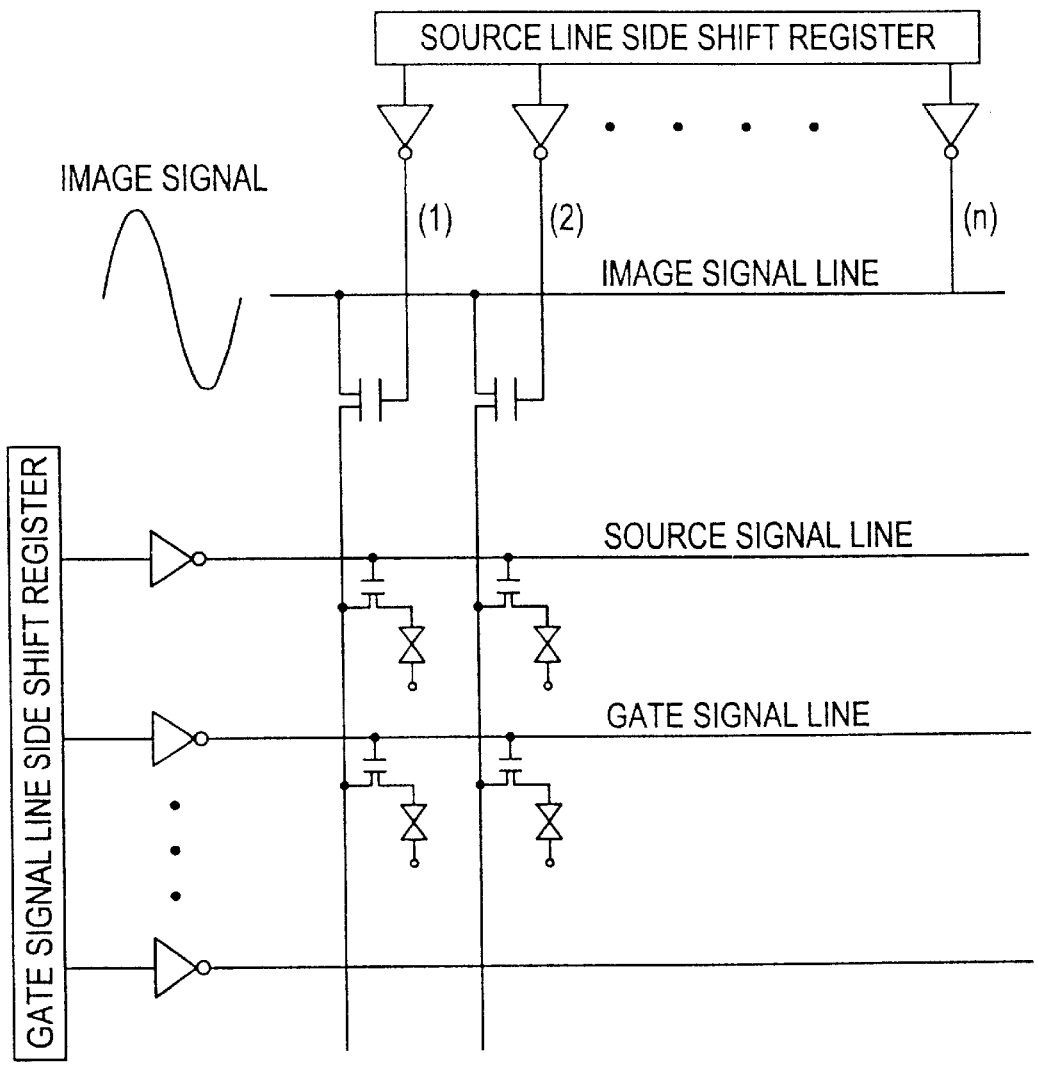
FIGS. 1A and 1B are schematic diagrams showing a conventional active matrix liquid crystal display device.
Figure 1B:
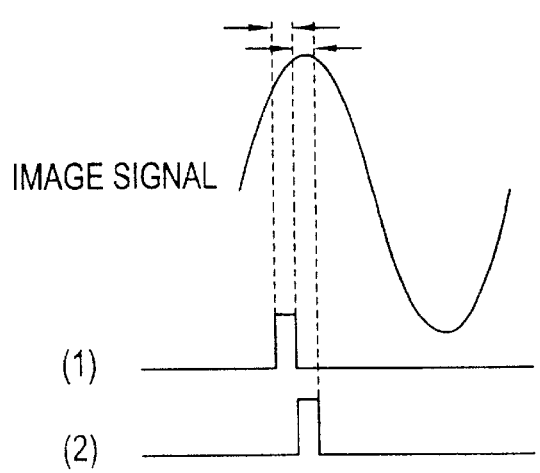
Figure 2:
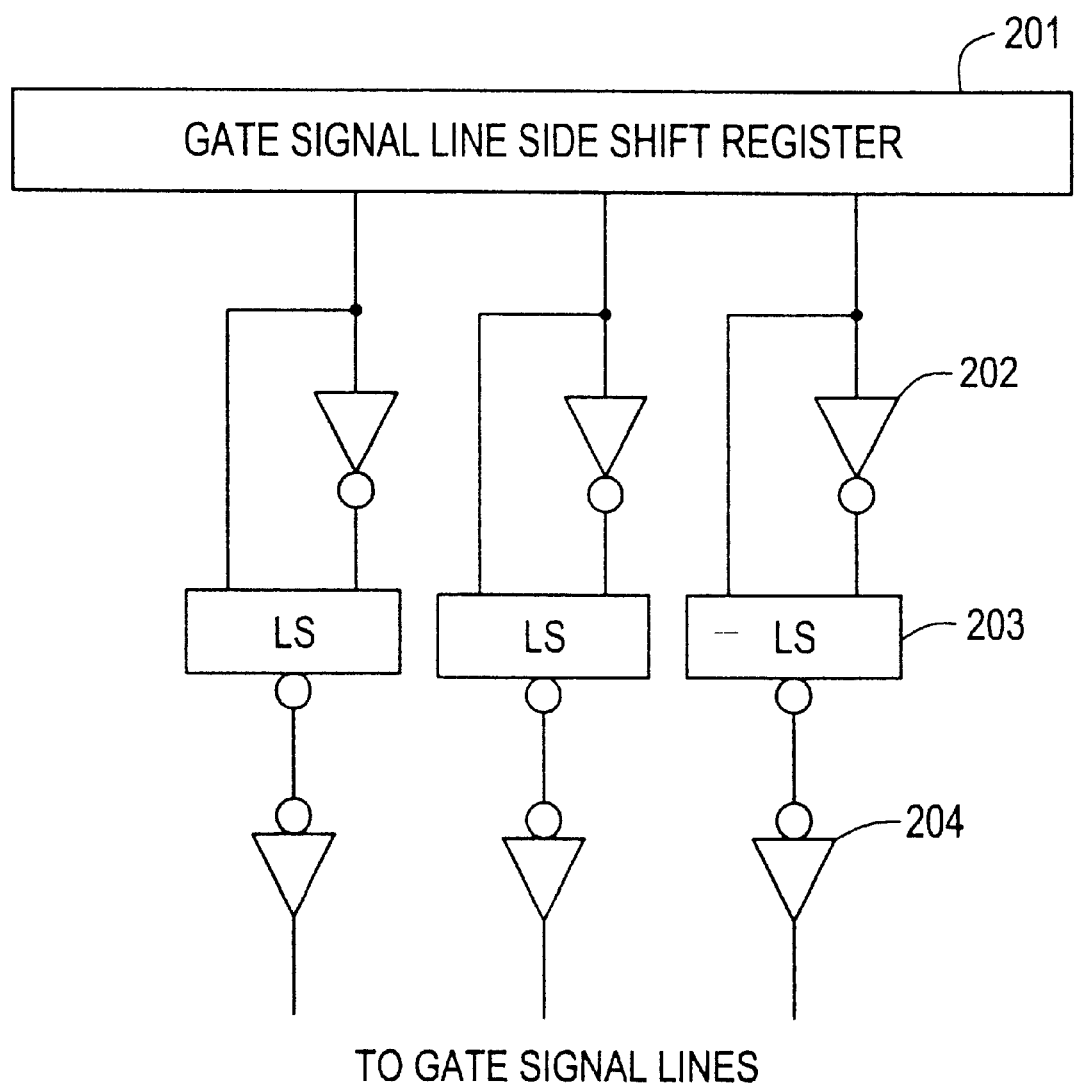
FIG. 2 is a schematic diagram showing a gate signal line side drive circuit in the conventional active matrix liquid crystal display device.
Figure 3A:
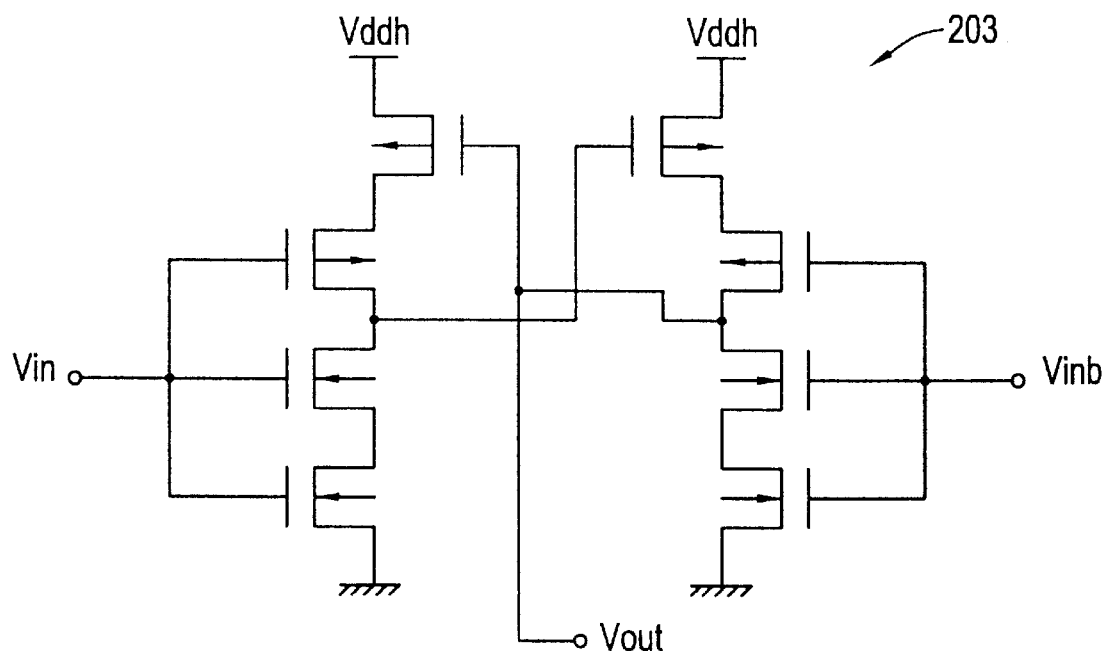
FIGS. 3A and 3B are circuit diagrams showing a conventional level shifter and final-stage invertor.
Figure 3B:
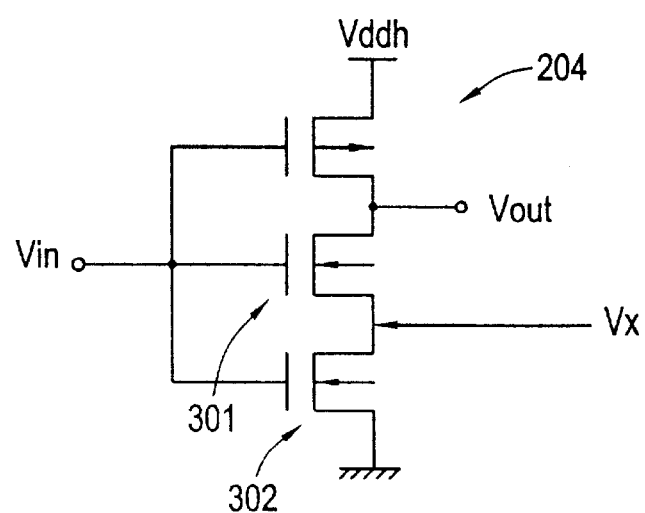
Figure 4:
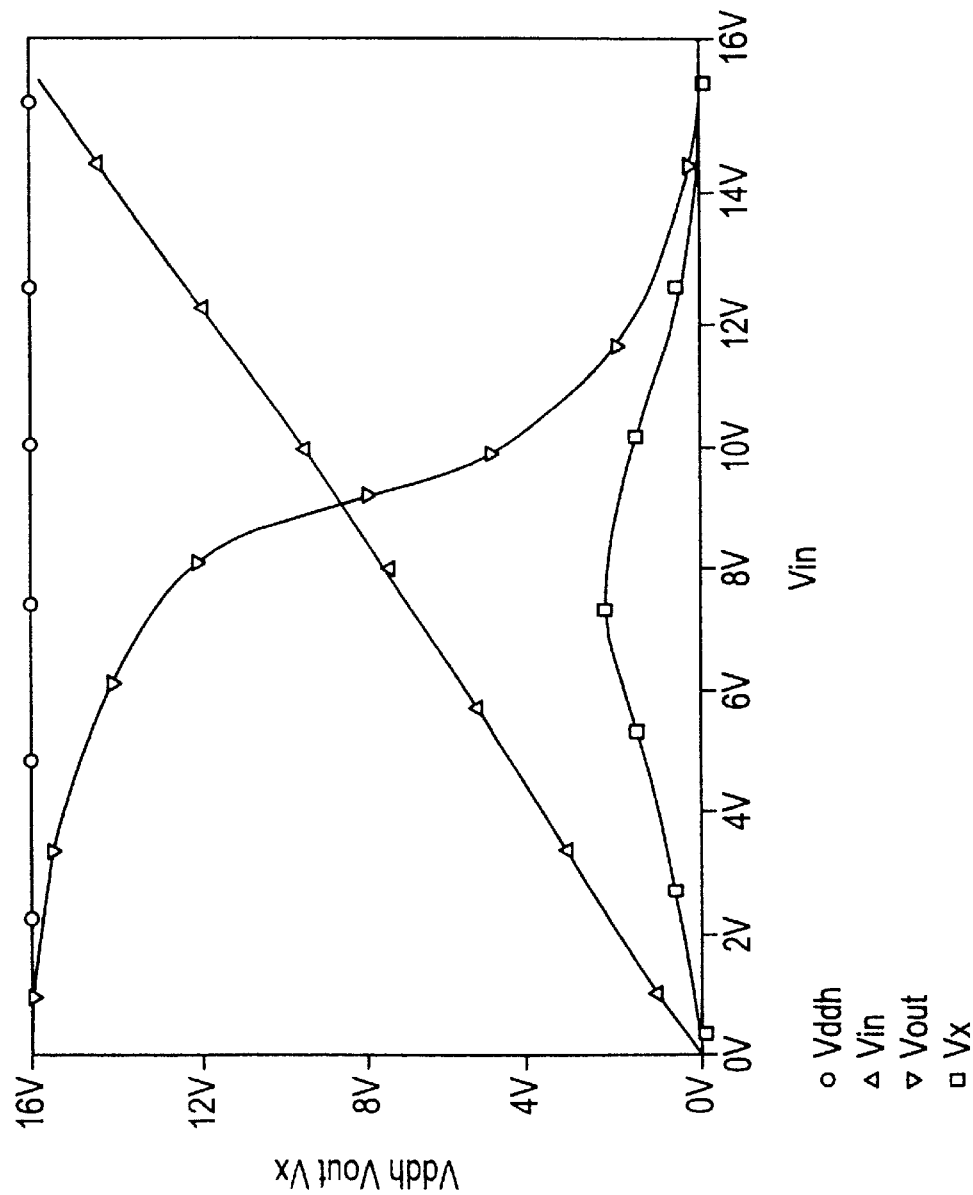
FIG. 4 is a diagram showing the simulation results of a change of voltage in the conventional final-stage invertor.
Figure 5:
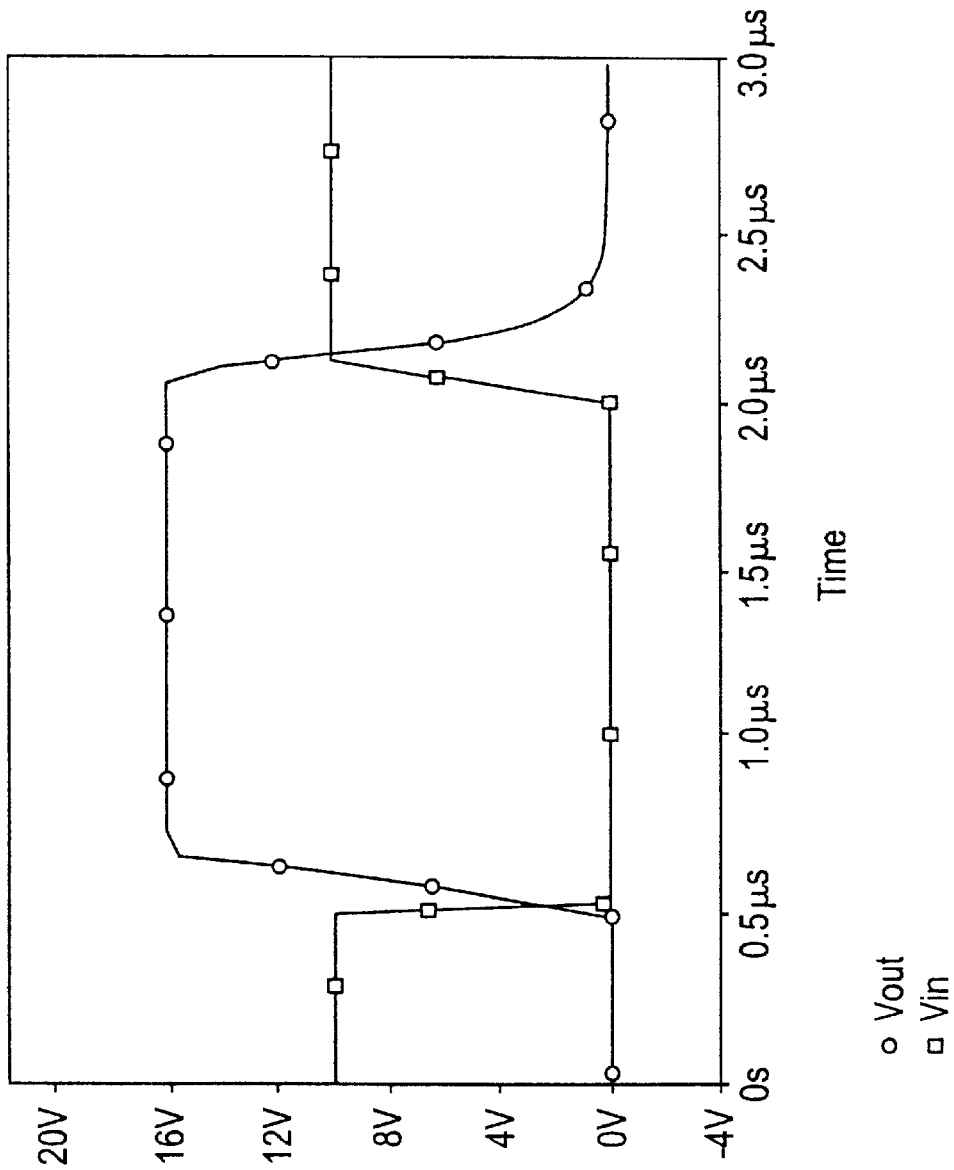
FIG. 5 is a diagram showing an output waveform of the conventional final-stage invertor.

Compared the output waveform from the final-stage invertor to the gate signal line as shown in FIG. 5 with FIG. 10, there is a tendency that the falling of the output from the invertor of this embodiment is slightly later. It is presumed that this is because the gate voltage of Tr10 shown in FIG. 7B is limited. However, it is expected that this can be solved by optimizing the size of the TFT without any problems.

Also, the simulation results of the level shifter is not particularly described in this embodiment. However, it is needless to say that the same effect as that of the final-stage invertor 604 of this embodiment is obtained since the bias voltage Vdd1 is applied to those two n-channel TFTs Tr3 and Tr7.

From the above viewpoint, the use of the level shifter 603 and the final-stage invertor 604 according to this embodiment makes it possible to increase a voltage margin of the TFT that constitutes the level shifter 603 and the final-stage invertor 604. Hence, even in the case where the application of a high voltage is necessary for driving the gate signal line, a change as a time elapses such that the threshold voltage of the TFT, etc., fluctuates due to hot carriers can be prevented from occurring. As a result, a linear defect due to a defect of the gate signal line, etc., can be prevented, thereby being capable of preventing the degradation of an image quality.

In this embodiment, a plurality of invertors or buffers may be further added in between the level shifter 603 and the final-stage invertor 604. In this case, a bias voltage is applied to one of n-channel TFTs in the CMOS circuit that constitutes the added invertors or buffers, as in the final-stage invertor 604 according to this embodiment.

Also, even when a high voltage is necessary for driving the gate signal line, the drive circuit of this embodiment is divided into a circuit driven at a low voltage and a circuit driven at a high voltage, and since it is unnecessary to drive all the circuits at the high voltage, power consumption can be reduced.

[Second Embodiment]

This embodiment shows an example of a circuit that constitutes a level shifter and a final-stage invertor in a high-supply-voltage drive section of a gate signal line side driver.

Referring to FIGS. 11A and 11B, FIG. 11A shows a circuit of the level shifter and the final-stage invertor which are made up of 12 TFTs Tr1 to Tr12.

In FIG. 11A, reference numeral 1101 to 1106 denote semiconductor layers that constitute the enhancement TFTs Tr1 to Tr12. Reference numeral 1107 denotes a first wiring layer which is used as the gate electrodes of the TFTs or lead wirings for output. Also, reference numeral 1108 denotes a second wiring layer which is connected with input terminals (Vin and Vinb) and power supply terminals (Vdd1, Vdd2 and Vss terminals) with the TFTs. Also, in the figure, portions painted by black as indicated by reference numeral 1109 indicate that those portions are in contact with wirings or the semiconductor layers under those portions. In the figure, the wirings of the same pattern are all the same wiring layer. The output terminal Vout is connected to the gate signal line.

In this embodiment, the channel length (L) and the channel width (W) of Tr1 to Tr12 are designed as stated below.

$Tr1, Tr2, Tr5, Tr6; L = 4 \ \mu m, W = 60 \ \mu m$ $Tr3, Tr4, Tr7, Tr8; L = 4 \ \mu m, W = 40 \ \mu m$ $Tr9, Tr10; L = 4 \ \mu m, W = 120 \ \mu m$ $Tr11, Tr12; L = 4 \ \mu m, W = 80 \ \mu m$

FIG. 11B shows an equivalent circuit of FIG. 11A.

In this embodiment, Vdd1, Vdd2 and Vss are used as a power supply, and Vdd2−Vss=16V, and Vdd1−Vss=10V.

In the level shifter of this embodiment, a signal is inputted to two inputs of Vin and Vinb. The level shifter of this embodiment is designed in such a manner that when Vin is Hi, Lo is sent out to the final-stage invertor, and when Vin is Lo, Hi is sent out to the final-stage invertor.

In the drive circuit for the gate signal line thus structured in this embodiment, a bias voltage is applied to the n-channel TFT which is close to the p-channel TFT in the CMOS circuit of the final-stage invertor which is connected to the level shifter and the gate signal line. Hence, as described in the first embodiment, the voltage margin of the TFTs that constitute the level shifters and the final-stage invertors can be increased.

Also, even when it is necessary to apply a high voltage for driving the gate signal line, a change as a time elapses such that the threshold voltage of the TFT, etc., fluctuates due to hot carriers can be prevented from occurring. As a result, a linear defect due to a defect of the gate signal line, etc., can be prevented, thereby being capable of preventing the degradation of an image quality.

[Third Embodiment]

In this embodiment, a description will be given of a process of manufacturing a liquid crystal display device having a driver circuit used in the first or second embodiment.

In this embodiment, there is shown in FIGS. 12A to 16 an example in which a plurality of TFTs are formed on a substrate having an insulating surface, and a peripheral circuit including a driver circuit and a pixel matrix circuit are structured in monolithic. In this embodiment, the peripheral circuit such as the driver circuit and the logic circuit is exemplified by a CMOS circuit that is a basic circuit. In this embodiment, a process of manufacturing a CMOS circuit in which a p-channel type and an n-channel type have one gate electrode, respectively, will be described, but a CMOS circuit having a plurality of gate electrodes as in the double gate type can be also manufactured.

Referring to FIGS. 12A to 12D, a quartz substrate 1201 is prepared as a substrate having an insulating surface. A silicon substrate on which a thermal oxide film is formed may be used as the quartz substrate. Also, a method in which an amorphous silicon film is formed on the quartz substrate once, and is then thermally oxidized completely into an insulating film may be taken. In addition, a quartz substrate, a ceramics substrate or a silicon substrate on which a silicon nitride film is formed as the insulating film may be used.

Reference numeral 1202 denotes an amorphous silicon film which is adjusted such that a final thickness thereof (a thickness taking a reduction of the film after thermal oxidization has been made into consideration) becomes 10 to 75 nm (preferably 15 to 45 nm). It is important to perfectly manage the concentration of impurities in the film when forming the film.

In case of this embodiment, the concentrations of C (carbon), N (nitrogen), O (oxygen) and S (sulfur) which are representative impurities in the amorphous silicon film 1202 are managed so as to be all less than $5 \times 10^{18}$ atoms/cm$^3$ (preferably, $1 \times 10^{18}$ atoms/cm$^3$ or less). If the respective impurities exist with the concentration more than the above range, the film is adversely affected by the impurities at the time of crystallizing, thereby leading to the degradation of the film quality after crystallization.

The concentration of hydrogen in the amorphous silicon film 1202 is also a very important parameter, and it appears that a film excellent in crystallinity is obtained when the content of hydrogen is suppressed to a lower value. For that reason, it is preferable that the formation of the amorphous silicon film 1202 is made through the low pressure CVD method. The plasma CVD method may be used by optimizing the film forming conditions.

Then, a process of crystallizing the amorphous silicon film 1202 is conducted. A technique disclosed in Japanese Patent Unexamined Publication No. Hei 7-130652 is used as crystallizing means. Although any means in Embodiment 1 and Embodiment 2 of the above publication may be used, it is preferable to use the technique disclosed in Embodiment 2 of that publication (the details are disclosed in Japanese Patent Unexamined Publication No. Hei 8-78329) in this embodiment.

The technique disclosed in Japanese Patent Unexamined Publication No. Hei 8-78329 is that a mask insulating film 1203 that selects a catalytic element added region is first formed. The mask insulating film 1203 has opening portions at a plurality of portions for addition of the catalytic elements. A position of the crystal region can be determined by the position of the opening portion.

Figure 12A:
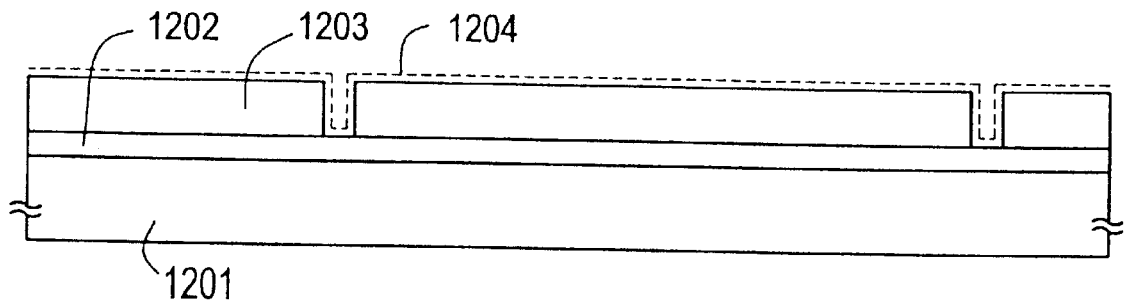
FIGS. 12A to 12D are diagrams showing a process of manufacturing a liquid-crystal display device according to the third embodiment.

Then, a solution containing nickel (Ni) therein as catalytic elements that promote the crystallization of the amorphous silicon film is coated on the surface through the spin coating method to form an Ni contained layer 1204. As the catalytic elements, nickel can be replaced by cobalt (Co), iron (Fe), palladium (Pd), platinum (Pt), copper (Cu), gold (Au) and so on (FIG. 12A).

Also, the process of adding the catalytic elements may be made by the ion implantation method using a resist mask or the plasma doping method. In this case, since a reduction in an area occupied by the added region and a control of the growth distance in the lateral growth region are facilitated, it becomes an effective technique when a fined circuit is structured.

Then, upon the completion of the process for adding the catalytic elements, after hydrogen is eliminated at 450° C. for about one hour, a heat treatment is made at a temperature of 500 to 700° C. (representatively 550 to 650° C.) in an inactive atmosphere, a hydrogen atmosphere or an oxygen atmosphere for 4 to 24 hours to crystallize the amorphous silicon film 1002. In this embodiment, the heat treatment is conducted in a nitrogen atmosphere at 570° C. for 14 hours.

Figure 12B:
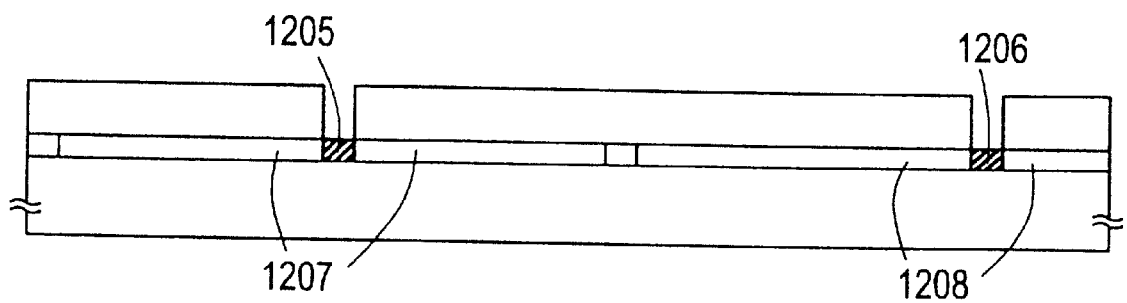

In this state, the crystallization of the amorphous silicon film 1202 progresses preferentially from a nucleus produced in the regions 1205 and 1206 to which nickel is added to form crystal regions 1207 and 1208 that grow substantially, in parallel with the substrate surface of the substrate 1201. Those crystal regions 1207 and 1208 are called "lateral growth region". Because the individual crystals are gathered in a state where they are relatively uniformly disposed in the lateral growth region, there is advantageous in that the lateral growth region is excellent in crystallinity (FIG. 12B).

Similarly, in the case of using the technique disclosed in Embodiment 1 of the above Japanese Patent Unexamined Publication No. Hei 7-130652, a region which can be micro-visually called "lateral growth region" is formed. However, since the generation of nucleus is nonuniformly made on the plane, the controllability of the grain boundary is not excellent.

Figure 12C:
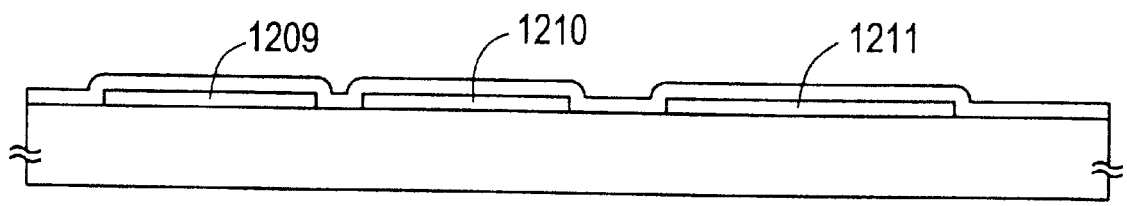

After the heat treatment for crystallization has been completed, the mask insulating film 1203 is removed to conduct patterning, thereby forming island-like semiconductor layers (active layers) 1209, 1210 and 1211 which are formed of the lateral growth regions 1207 and 1208 (FIG. 12C).

Reference numeral 1209 denotes an active layer of the n-type TFT that constitutes the CMOS circuit; 1210 is an active layer of the p-type TFT that constitutes the CMOS circuit; and 1211 is an active layer of the n-type TFT (pixel TFT) that constitutes a pixel matrix circuit.

After the active layers 1209, 1210 and 1211 are formed, a gate insulating film 1212 formed of an insulating film containing silicon is formed on those active layers.

Figure 12D:
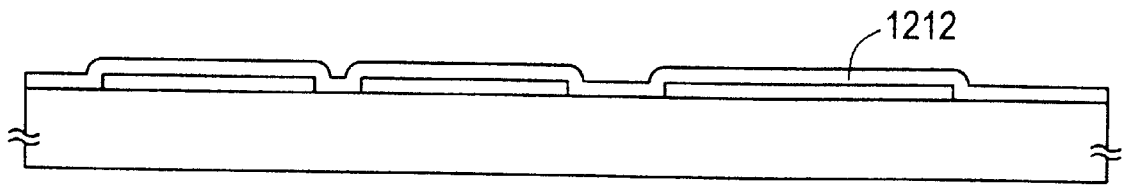

Subsequently, a heat treatment (process for gettering the catalytic elements) for removing or reducing the catalytic elements (nickel) as shown in FIG. 12D is conducted. This heat treatment is that halogen elements are allowed to be contained in the process atmosphere to utilize the gettering effect of the halogen elements on the metal elements.

In order to sufficiently obtain the gettering effect of the halogen elements, it is referable to conduct the heat treatment at a temperature exceeding 700° C. When the temperature is 700° C. or lower, the decomposition of halogen compound in the processing atmosphere becomes difficult, with the result that there is a risk that the gettering effect cannot be obtained.

For that reason, in this embodiment, the heat treatment is conducted at a temperature exceeding 700° C., preferably 800 to 1000° C. (representatively 950° C.), and a processing period is set to 0.1 to 6 hours, representatively 0.5 to 1 hour.

This embodiment shows an example in which a heat treatment is conducted at 950° C. for 30 minutes in an atmosphere containing hydrogen chloride (HCl) with the concentration of 0.5 to 10 vol % (3 vol % in this embodiment) with respect to the oxygen atmosphere. If the concentration of HCl is set to more than the above concentration, since unevenness occurs on the surface of the active layers 1209, 1210 and 1211 to the degree of the thickness, such a concentration is not preferable.

Also, although an example using HCl gas as a compound containing halogen elements therein is described, there can be used as another gas, one kind or plural kinds of elements selected from compound including halogen such as HF, $NF_3$, HBr, $Cl_2$, $ClF_3$, $BCl_3$, $F_2$, $Br_2$ or the like, representatively.

In this process, it is presumed that nickel in the active layers 1209, 1210 and 1211 is gettered by the action of chlorine into volatile nickel chloride, and nickel chloride is removably eliminated to the atmosphere. Then, after this process has been conducted, the concentration of nickel in the active layers 1209, 1210 and 1211 is reduced down to $5 \times 10^{17}$ atoms/cm$^3$ or less.

The value of $5 \times 10^{17}$ atoms/cm$^3$ is a lower limit of detection of SIMS (secondary ion mass spectroscopy). As a result of analyzing the TFT sampled by the present inventors, there has not been confirmed an influence of nickel on the TFT characteristic when the concentration is $1 \times 10^{18}$ atoms/cm$^3$ or less (preferably $5 \times 10^{17}$ atoms/cm$^3$ or less). In the present specification, the concentration of impurities is defined by the minimum value of the measured results of the SIMS analysis.

Through the above heat treatment, a thermal oxidation reaction progresses on a boundary between the active layers 1209, 1210 and 1211 and the gate insulating film 1212, and the thickness of the gate insulating film 1212 increases as much as the thickness of the thermal oxidizing film. When the thermal oxide film is thus formed, there can be obtained a semiconductor/insulating film boundary very small in boundary level. Also, there is an effect of preventing the failure of formation of the thermal oxide film on the active layer end portion (edge sinning).

Further, if a heat treatment is conducted in the nitrogen atmosphere at 950° C. for about one hour after the above heat treatment is conducted in the halogen atmosphere, the quality of the gate insulating film 1212 is effectively improved.

It has been confirmed through the SIMS analysis that the halogen elements used for the gettering process remain in the active layers 1209, 1210 and 1211 with the concentration of $1 \times 10^{15}$ to $1 \times 10^{20}$ atoms/cm$^3$. Also, in this situation, it has been confirmed through the SIMS analysis that the above-described halogen elements are distributed with a high concentration between the active layers 1209, 1210 and 1211 and the thermal oxide film formed through the heat treatment.

Also, as a result of conducting the SIMS analysis on other elements, it has been confirmed that the concentrations of C (carbon), N (nitrogen), O (oxygen) and S (sulfur) which are representative impurities are all Less than $5 \times 10^{18}$ atoms/cm$^3$ (representatively, $1 \times 10^{18}$ atoms/cm$^3$ or less).

Figure 13A:
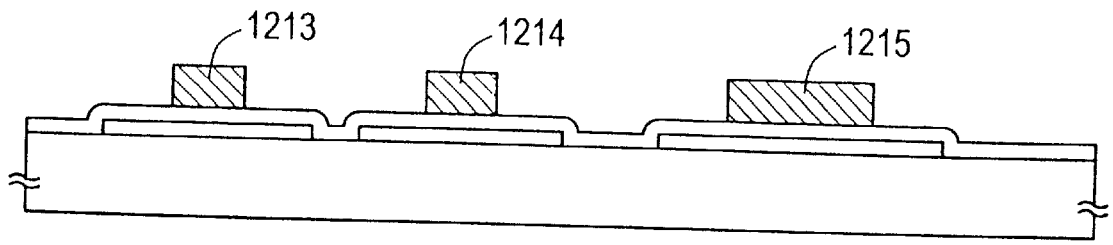
FIGS. 13A to 13D are diagrams showing a process of manufacturing a liquid-crystal display device according to the third embodiment.

Then, a metal film (not shown) mainly containing aluminum is formed on the surface to form originals 1213, 1214 an 1215 of gate electrodes, which will be formed later, through patterning. In this embodiment, an aluminum film containing scandium of 2 wt % is used (FIG. 13A).

Figure 13B:
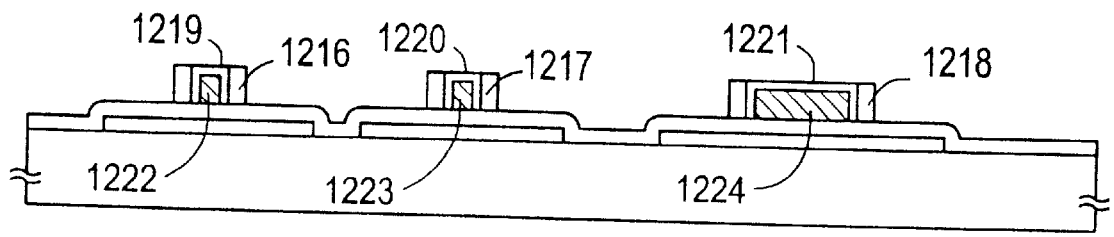

Subsequently, porous anodic oxide films 1216, 1217 and 1218, non-porous anodic oxide films 1219, 1220 and 1221, and gate electrodes 1222, 1223 and 1224 are formed through the technique disclosed in Japanese Patent Unexamined Publication No. Hei 7-135318 (FIG. 13B).

Figure 13C:
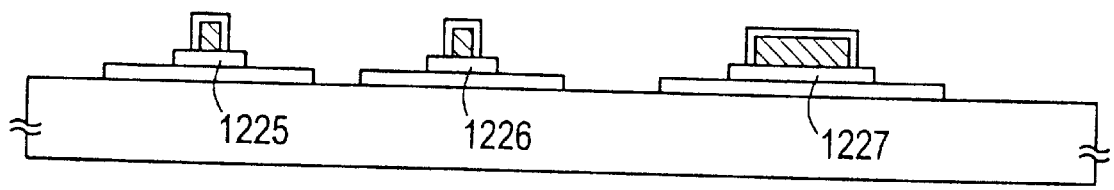

After the state shown in FIG. 13B is obtained, the gate insulating film 1212 is etched with the gate electrodes 1222, 1223 and 1224, and the porous anodic oxide films 1216, 1217 and 1218 as masks. Then the porous anodic oxide films 1216, 1217 and 1218 are removed to thereby obtain a state shown in FIG. 13C. In FIG. 13C, what are indicated by reference numeral 1225, 1226 and 1227 are gate insulating films as processed.

Then, a process of adding impurity elements that give one conductivity is conducted. The impurity elements to be used may be P (phosphorus) or As (arsenic) if they are of the n-type, and B (boron) if they are of the p-type.

In this embodiment, the addition of impurities are conducted by two separate processes. First, the first addition of impurities (P (phosphorus) is used in this embodiment) is conducted at a high acceleration voltage of about 80 keV to form an n$^-$ region. The n$^-$ region is adjusted such that the concentration of P ions becomes $1 \times 10^{18}$ to $1 \times 10^{19}$ atoms/cm$^3$.

Further, the second addition of impurities is conducted at a low acceleration voltage of about 10 keV to form an n$^+$ region. In this situation, since the acceleration voltage is low, the gate insulating film functions as a mask. Also, the n$^+$ region is adjusted so that the sheet resistance becomes 500Ω or less (preferably 300Ω or less).

Figure 13D:
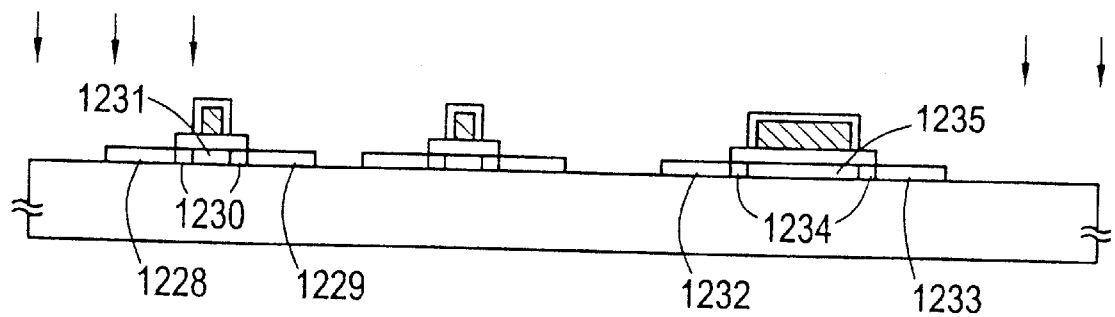

Through the above processes, a source region 1228, a drain region 1229, a low-concentration impurity region 1230 and a channel formation region 1231 of the n-type TFT that constitutes the CMOS circuit are formed. Also, a source region 1232, a drain region 1233, a low-concentration impurity region 1234 and a channel formation region 1235 of the n-type TFT that constitutes the pixel TFT are decided (FIG. 13D). In the state shown in FIG. 13D, the active layer of the p-type TFT that constitutes the CMOS circuit is also identical in structure with the active layer of the n-type TFT. Subsequently, as shown in FIG. 14A, a resist mask 1236 is coated on the n-type TFT to add impurity ions that give p-type (boron is used in this embodiment).

Likewise as the above-mentioned process of adding the impurities, this process is separated into two processes and conducted, and because it is necessary to revert n-type to p-type, B (boron) ions of the concentration several times as high as the above-described concentration of added P ions are added.

Figure 14A:
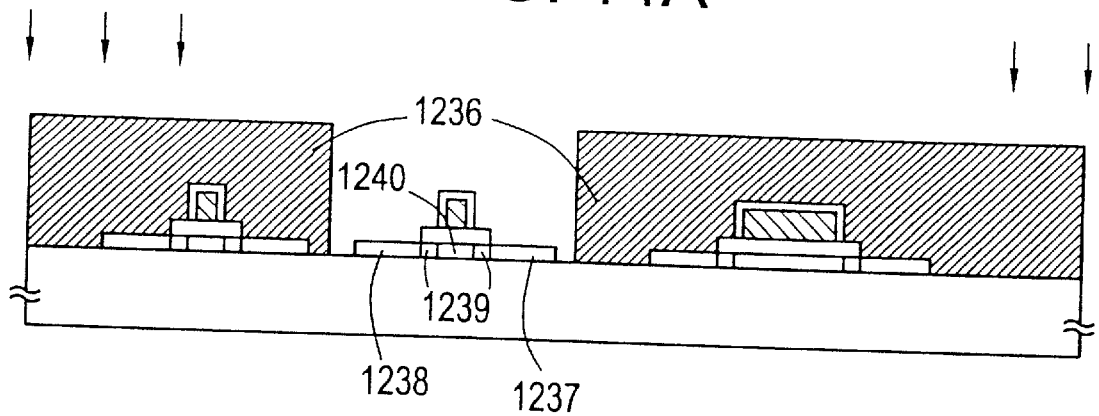
FIGS. 14A to 14C are diagrams showing a process of manufacturing a liquid-crystal display device according to the third embodiment.

In this way, a source region 1237, a drain region 1238, a low-concentration impurity region 1239 and a channel formation region 1240 of the p-type TFT that constitutes the CMOS circuit are formed (FIG. 14A).

After the active layer has been thus completed, the impurity ions are activated by the combination of furnace annealing, laser annealing, a lamp annealing and so on. At the same time, an damage on the active layer which is produced during the adding process is also repaired.

Figure 14B:
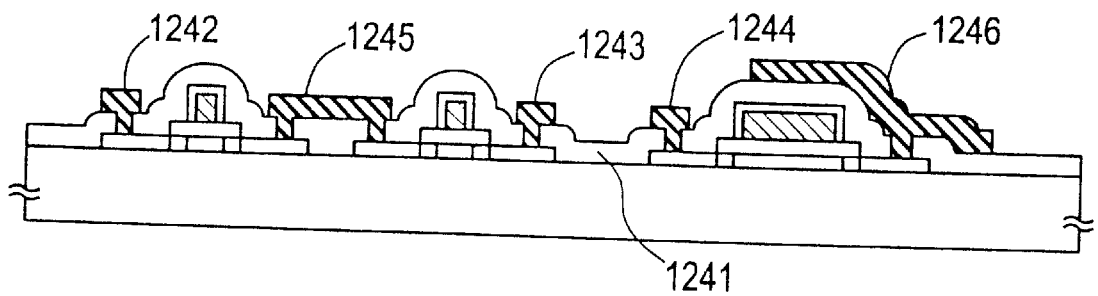

Then, after a lamination film consisting of a silicon oxide film and a silicon nitride film is formed as an interlayer insulating film 1241 to form contact holes, source electrodes 1242, 1243 and 1244, and drain electrodes 1245 and 1246 are formed to obtain a state shown in FIG. 14B.

Figure 14C:
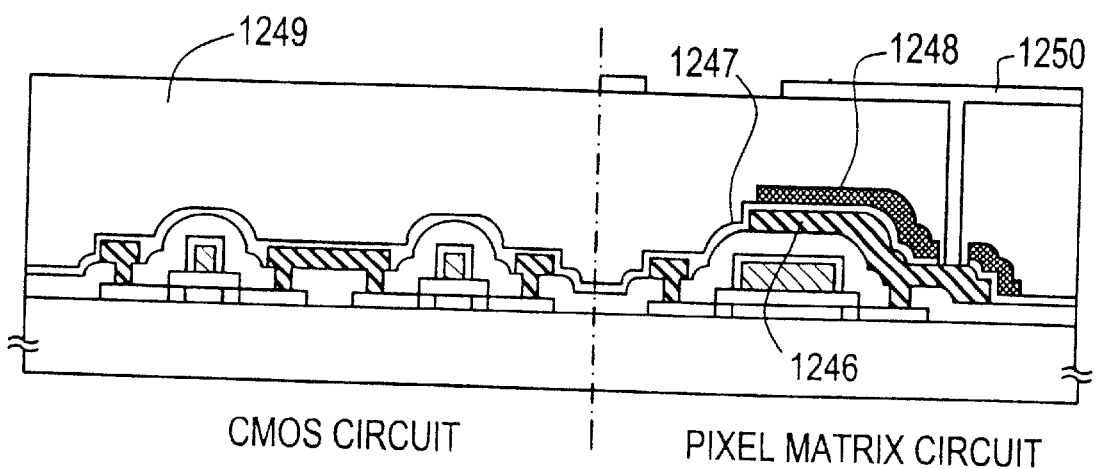

Subsequently, a silicon nitride film 1247 which is 10 to 50 nm in thickness and a black mask 1248 are formed (FIG. 14C).

In the structure of FIG. 14C, an auxiliary capacitance is formed between the drain electrode 1246 and the black mask 1248 through the silicon nitride film 1247.

In this way, the structure of FIG. 14C is characterized in that the black mask 1248 also functions as an upper electrode of the auxiliary capacitance.

In the structure shown in FIG. 14C, the auxiliary capacitance which is liable to occupy a large area is formed on the TFT, thereby being capable of preventing the opening ratio from being lowered. Also, since the silicon nitride film high in permittivity can be used with the thickness of about 25 nm, a very large capacitance can be ensured with a reduced area.

Subsequently, a second interlayer insulating film 1249 formed of an organic resin film is formed in thickness of 0.5 to 3 μm. Then, a conductive film is formed on the interlayer insulating film 1249 and then patterned to form a pixel electrode 1250. Because this embodiment is an example of a transmission type, a transparent conductive film such as ITO is used as a conductive film that constitutes the pixel electrode 1250.

Then, the entire substrate is heated in a hydrogen atmosphere at 350° C. for one to two hours to hydride the entire device, thereby compensating the dangling bond in the film (in particular, in the active layer). The above processes make it possible to form the CMOS circuit and the pixel matrix circuit on the same substrate.

Figure 15:
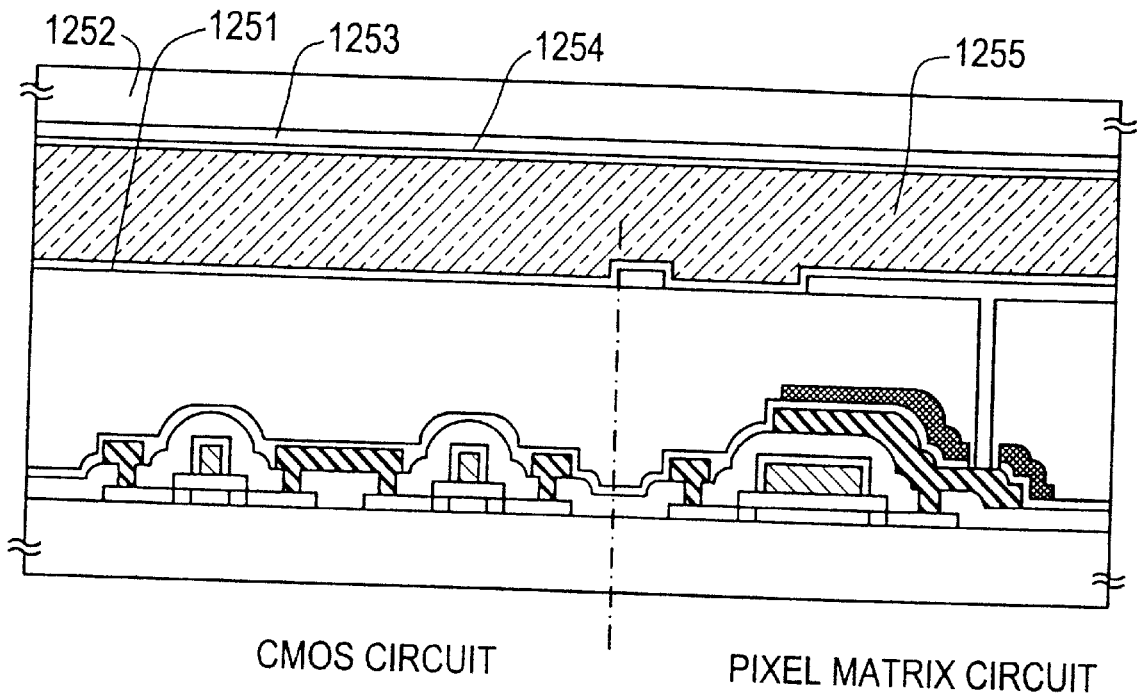
FIG. 15 is a cross-sectional view showing a liquid crystal display device according to the third embodiment.

Subsequently, as shown in FIG. 15, a process of manufacturing a liquid crystal panel on the basis of an active matrix substrate produced through the above processes will be described.

An orientation film 1251 is formed on the active matrix substrate in the state shown in FIG. 14C. In this embodiment, polyimide is used for the orientation film 1251. Then, an opposed substrate is prepared. The opposed substrate is made up of a glass substrate 1252, a transparent conductive film 1253 and an orientation film 1254.

In this embodiment, the orientation film is formed of a polyimide film such that liquid crystal molecules is oriented so as to be perpendicular to the substrate. After the orientation film has been formed, a rubbing process is conducted so that the liquid crystal molecules are vertically oriented with a given pre-tilt angle.

Although a black mask, a color filter and so on are formed on the opposed substrate as occasions demand, their description will be omitted here.

Thereafter, the active matrix substrate and the opposed substrate which has been processed above are bonded to each other through a seal material or a spacer (not shown) through a known cell assembling process. Then, a liquid crystal material 1055 is poured in between both the substrates to completely sealingly enclose the liquid crystal material 1055 by a sealant (not shown). Hence, a transmission type liquid crystal panel as shown in FIG. 15 is completed.

In this embodiment, the liquid crystal panel is designed to conduct display by an ECB (electric field controlled birefringence) mode. Therefore, there is arranged such that the liquid crystal panel is held between a pair of polarizing plates (not shown) in a cross nicol (a state in which the paired polarizing plates allow the respective polarization axes to be orthogonal to each other).

Accordingly, it can be understood that in this embodiment, display is conducted in a normally black mode where black display is made when no voltage is applied to the liquid crystal panel.

Figure 16:
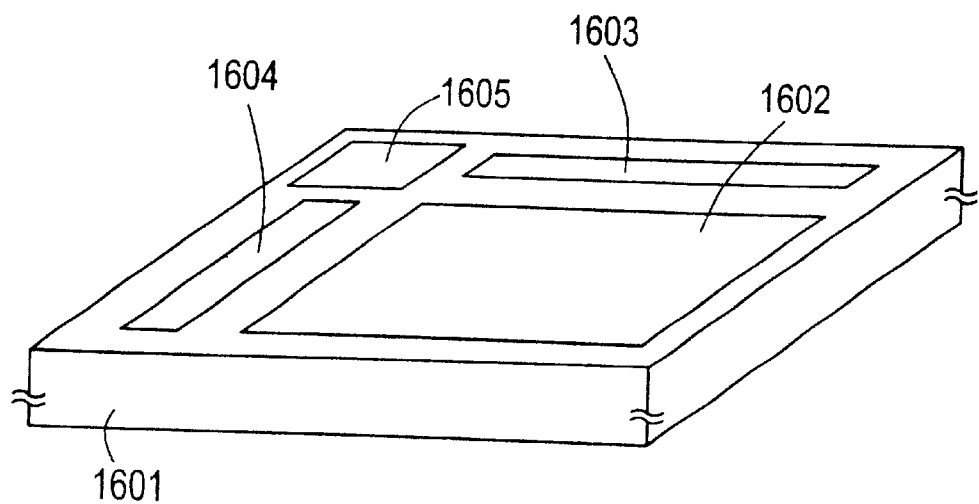
FIG. 16 is a perspective view showing an active matrix substrate in a liquid crystal display device according to the third embodiment.

Also, the appearance of the active matrix substrate shown in FIG. 14C is simplified into FIG. 16. In FIG. 16, reference numeral 1601 denotes a quartz substrate; 1602 is an pixel matrix circuit; 1603 is a source driver circuit; 1604 is a gate driver circuit; and 1605 is a logic circuit.

In FIG. 16, a bias voltage is applied to one n-channel TFT in the CMOS circuit that constitutes the level shifter and the final-stage invertor connected to the gate signal line according to the present invention, which is formed in the gate driver circuit 1604 as described in the first or second embodiment. Hence, the withstand voltage of the gate driver circuit is made high.

The logic circuit 1605 includes all of the logic circuits made up of TFTs in a broad sense. However, in the present specification, in order to distinguish from circuits conventionally called the pixel matrix circuit and the driver circuit, the logic circuit 1605 is directed to signal processing circuits (memory, D/A convertor, pulse generator, etc.) other than the above circuits.

Also, the liquid crystal panel thus structured is fitted with an FPC (flexible print circuit) terminal as an external terminal. What is generally called "liquid crystal module" is a liquid crystal panel fitted with the FPC.

Further, the liquid crystal panel of this embodiment is designed such that the level shifter and the final-stage invertor according to the present invention are used as a drive circuit for the gate signal line, and can realize liquid crystal panels of all sizes over a projector type liquid crystal panel of about 2 inches and a large-screen liquid crystal panel of about ten several inches.

[Fourth Embodiment]

Figure 17A:
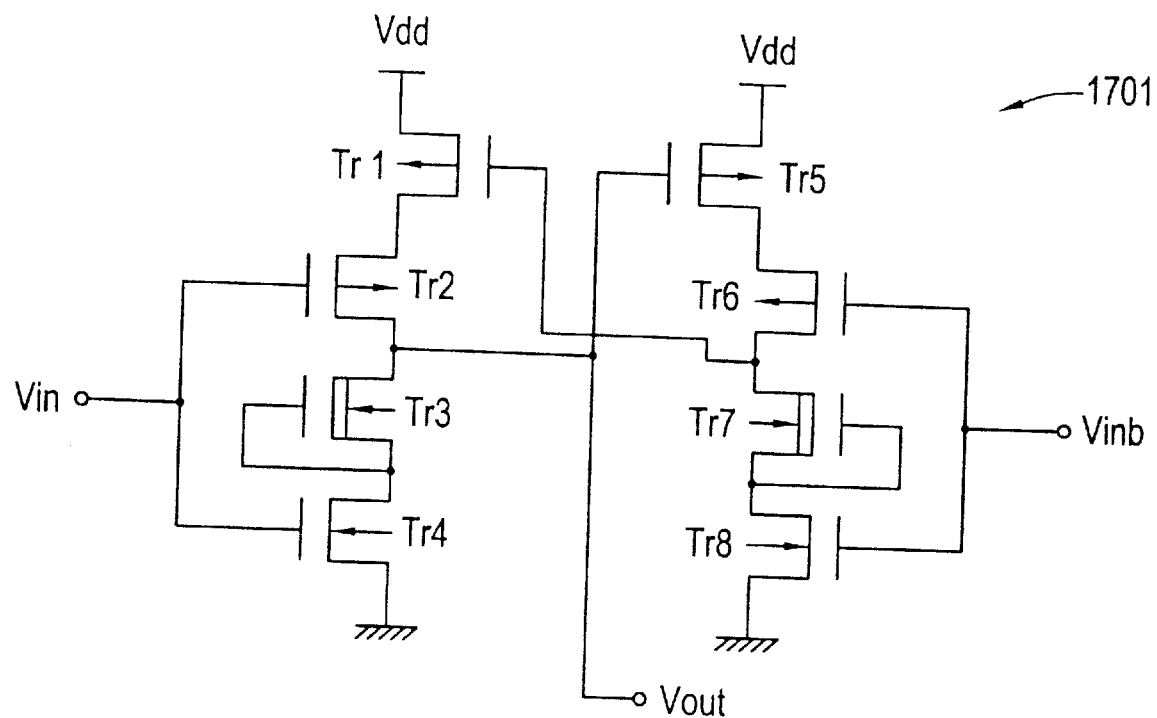
FIGS. 17A and 17B are circuit diagrams showing a level shifter and a final-stage invertor according to the fourth embodiment.
Figure 17B:
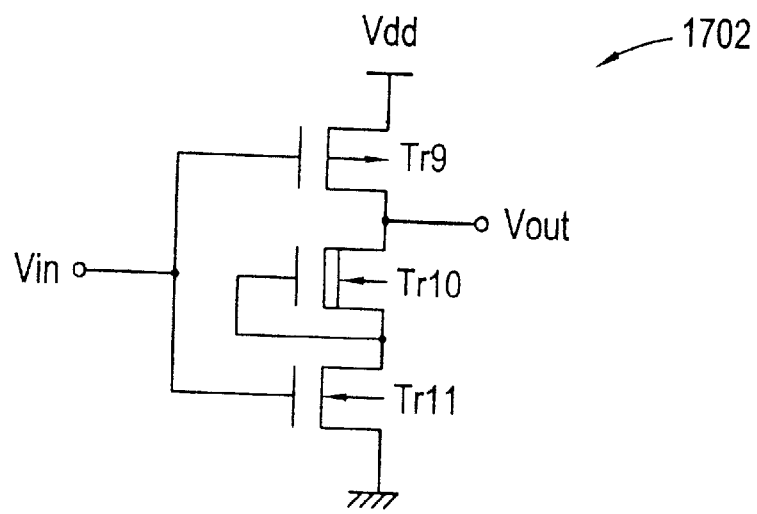

Referring to FIGS. 17A and 17B, a higher supply voltage than a low-supply-voltage drive section (shift register circuit, invertor, etc.) upstream of the level shifter thereof is applied to a level shifter 1701 in a high-supply-voltage drive section of a gate signal line side driver, and a final-stage invertor 1702 connected to the gate signal line according to this embodiment.

In the level shifter 1701 of this embodiment, symbols Tr3 and Tr7 denote depletion TFTs, and other Trs are enhancement TFTs (FIG. 17A). In FIGS. 17A and 17B, the respective TFTs are denoted by symbols Tr1 to Tr11.

Also, in the invertor 1702 of this embodiment, Tr10 is a depletion TFT, and Tr9 and Tr11 are enhancement TFTs.

In this embodiment, a description will be given of only the level shifter circuit and the final-stage invertor circuit, and as occasions demand, a shift register circuit, a analog buffer circuit, etc., are used as the gate signal line side driver.

Referring to FIG. 17A, the level shifter 1701 of this embodiment is made up of two CMOS circuits, to which a supply voltage Vdd is applied. The Tr4 and Tr8 are connected to GND. Also, there is designed such that a voltage between the source and the drain of Tr3 and Tr4 is applied to the gate electrode of Tr3. Similarly, there is designed such that a voltage between the source and the drain of Tr7 and Tr8 is applied to the gate electrode of Tr7. Hence, a voltage applied to Tr3 and Tr4 is substantially the half. Also, a voltage applied to Tr7 and Tr8 is distributed. Accordingly, the withstand voltage of the TFT can be made high so that no high load is exerted on only one TFT.

An input signal inputted from the shift register circuit (not shown) to the level shifter 1701 is such that when a signal Hi is inputted to Vin, its inversion signal Lo is inputted to Vinb. When the signal Hi is inputted to Vin of the level shifter 1701, a signal Lo is outputted from the output Vout.

Also, when the signal Lo is inputted to Vin of the level shifter 1701, the signal Hi whose voltage level is shifted to 16V is outputted from the output Vout. In other words, in the level shifter circuit, the level of the signal inputted to Vin is inverted and shifted to a high potential, and then send out to the final-stage invertor 1704.

FIG. 17B shows a circuit of the final-stage invertor 1702 which is to be connected to the gate signal line. The invertor 1702 is made up of a CMOS circuit including a single-gate p-channel TFT Tr9 and double-gate n-channel TFTs Tr10 and Tr11. The Tr10 and Tr11 are formed of the same semiconductor active layer. That is, Tr10 and Tr11 is structured by forming two gate electrodes on the same semiconductor active layer.

The supply voltage Vdd is also applied to the invertor 1702, and the n-channel TFT Tr10 is designed such that a voltage between the source and the drain of Tr10 and Tr11 is applied to the gate electrode of Tr10. Therefore, a voltage applied to Tr10 and Tr11 is distributed. Hence, there is no case in which a high load is exerted on only one TFT.

The output signal Vout from the level shifter 1701 shown in FIG. 17A is inputted to Vin of the invertor 1702 shown in FIG. 17B, and its inversion signal is outputted from the Vout, and then outputted to the gate signal line.

In the level shifter 1701 and the invertor 1702 according to this embodiment, depletion TFTs are used for Tr3, Tr7 and Tr10, which can be produced by changing the ion doping process in the process of manufacturing the CMOS circuit described in the third embodiment.

Also, the level shifter 1701 and the invertor 1702 of this embodiment are designed such that a voltage lower than the supply voltage is applied to the gate electrodes of Tr3, Tr7 and Tr10, thereby the with stand voltage of the TFT can be made high.

[Fifth Embodiment]

In this embodiment, a description will be given of a three-plate type projector in which a peripheral circuit integrated liquid crystal panel having the driver of the present invention as described in the above first, second or fourth embodiment is built.

Figure 18:
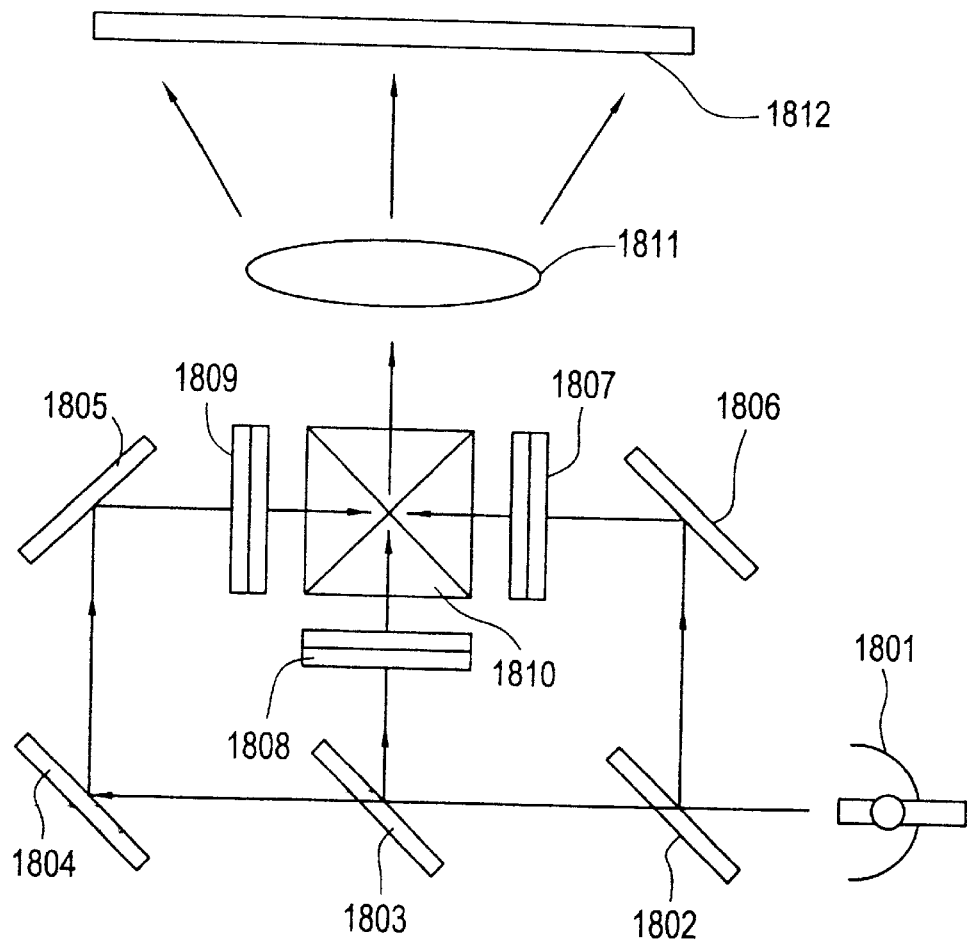
FIG. 18 is a structural diagram showing a three-plate type projector having the liquid crystal display device according to the fifth embodiment.

FIG. 18 shows a three-plate type liquid crystal projector using the liquid crystal panel of the third embodiment. Referring to FIG. 18, reference numeral 1801 denotes a light source, and 1802 and 1803 are dichroic mirrors that selectively reflect the light having wavelength regions of R (red) and G (green), respectively. Reference numeral 1804, 1805 and 1806 denote total reflection mirrors, and 1807, 1808 and 1809 are transmission type liquid crystal panels corresponding to R, G and B, respectively. Reference numeral 1810 denotes a dichroic prism, 1811 is a projection lens and 1812 is a screen.

The three-plate type liquid crystal projector according to this embodiment displays images corresponding to three primary colors consisting of red, blue and green on three monochrome-display liquid crystal panels 1807, 1808 and 1809, respectively, and lightens the above liquid crystal panels by lights of the corresponding three primary colors. Then, the obtained images of the respective primary-color components are composed by dichroic prism 1810 and then projected onto the screen 1812. Therefore, the three-plate type liquid crystal projector is excellent in display performance (resolution, screen illuminance, color purity).

[Sixth Embodiment]

In this embodiment, a description will be given of a single-plate type projector in which a peripheral circuit integrated liquid crystal panel having the driver of the present invention as described in the above first, second or fourth embodiment is built.

Figure 19:
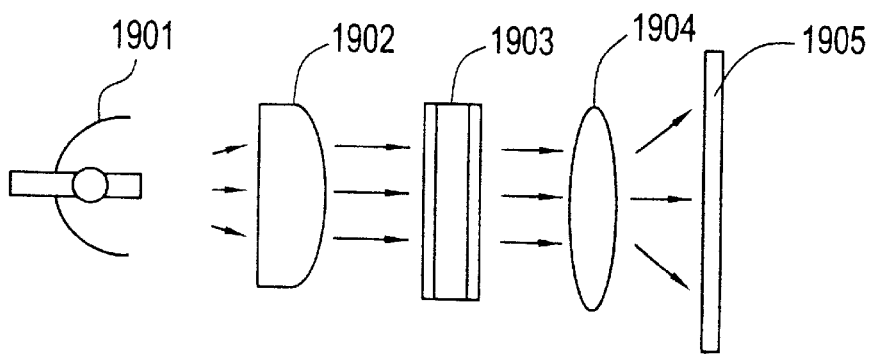
FIG. 19 is a structural diagram showing a single-plate type projector having the liquid crystal display device according to the sixth embodiment.

The structure of the single-plate type liquid crystal projector according to this embodiment is shown in FIG. 19. Reference numeral 1901 denotes a light source; 1902 is a condenser lens; 1903 is a liquid crystal panel; 1904 is a projection lens; and 1905 is a screen. A color filter is fitted onto the liquid crystal panel 1903.

In the single-plate type liquid crystal projector according to this embodiment, using the color filter, lights corresponding to the respective obtained pixels are projected onto the screen through a method in which the respective pixels of R, G and B are driven, respectively, by the same system as that of the direct-view type liquid crystal display device.

Compared with the three-plate type liquid crystal projector according to the fifth embodiment, since the number of optical parts is only 1/3, the single-plate type liquid crystal projector is excellent in price, size and so on. However, in the case where the same liquid crystal panel is used for the three-plate type liquid crystal projector and the conventional single-plate type liquid crystal projector, three colors are superimposed on one pixel in the three-plate type whereas one pixel is utilized as only a one-color pixel. As a result, the single-plate type is inferior in image quality to the three-plate type. In addition, the above single-plate type liquid crystal projector obtains a desired-color image by absorbing useless components of a white light from the light source with the color filter. Accordingly, the white light incident to the liquid crystal panel is not transmitted more than 1/3, thus making the use efficiency of the Light relatively low.

Hence, the three-plate type projector according to the fifth embodiment and the single-plate type projector according to this embodiment are employed depending on uses.

[Seventh Embodiment]

In this embodiment, a description will be given of a projector (projection TV) in which the liquid crystal projector described in the fifth embodiment or the sixth embodiment is built in a set as an optical engine.

Figure 20A:
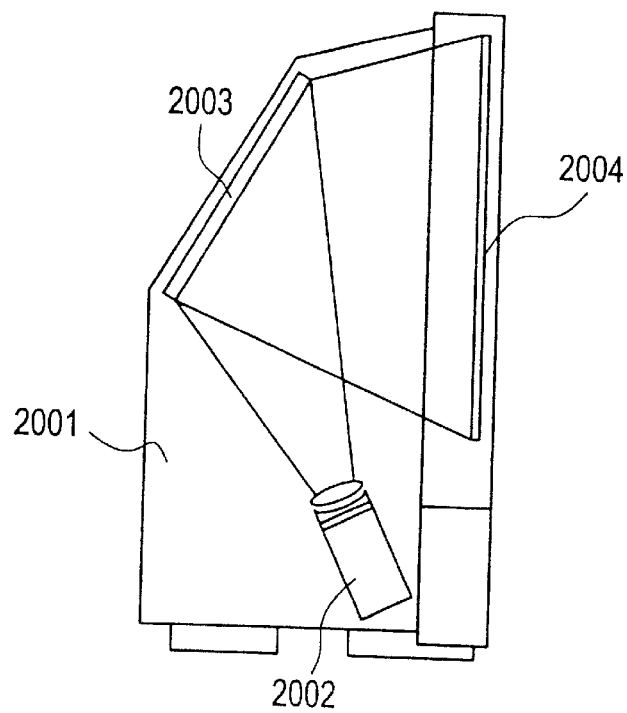
FIGS. 20A and 20B are structural diagrams showing a rear projector having the liquid crystal display device according to the seventh embodiment.
Figure 20B:
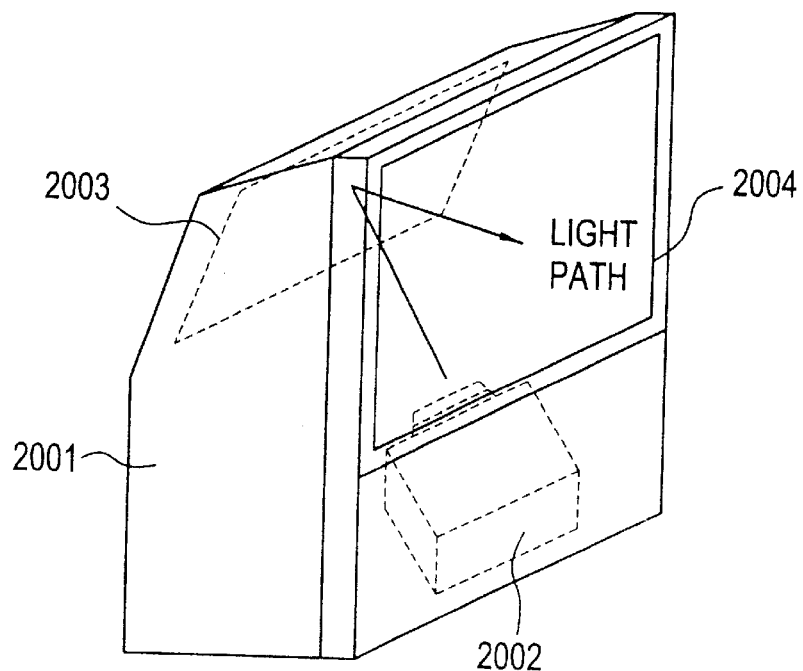

FIGS. 20A and 20B are diagrams showing the appearance of a projection TV according to this embodiment. The projection TV of this embodiment is of the type which is also generally called "rear type projector". FIG. 20A is a side view of a simplified internal structure. Also, FIG. 20B is a perspective view of the projection TV according to this embodiment.

In FIGS. 20A and 20B, reference numeral 2001 denotes a main body; 2002 is an optical engine in which a liquid crystal projector of the fourth embodiment or the fifth embodiment is built; 2003 is a reflector; and 2004 is a screen. Although the projection TV is complicated in structure because other optical systems are in fact added thereto, only the outline of structure is shown in this embodiment.

In the liquid crystal panel according to the fifth embodiment or the sixth embodiment, a peripheral drive circuit and a logic circuit are integrated with a pixel region. Accordingly, this liquid crystal panel is also adaptive to signals of the NTSC system, the PAL system and the digital system.

Also, even if a video signal is adaptive to the different resolutions as in XGA, SXGA or UXGA, degradation of resolution is prevented by device such as black display in which unnecessary portions (image non-display portion) is displayed in black by a logic circuit or the like, and an image with high contrast also can be provided.

[Eighth Embodiment]

In this embodiment, a description will be given of a liquid crystal projector different in structure from that of the seventh embodiment. The liquid crystal panel of the third embodiment is used in the liquid crystal projection of this embodiment, similarly. The device of this embodiment is of the type which is generally called "front-type projector".

Figure 21:
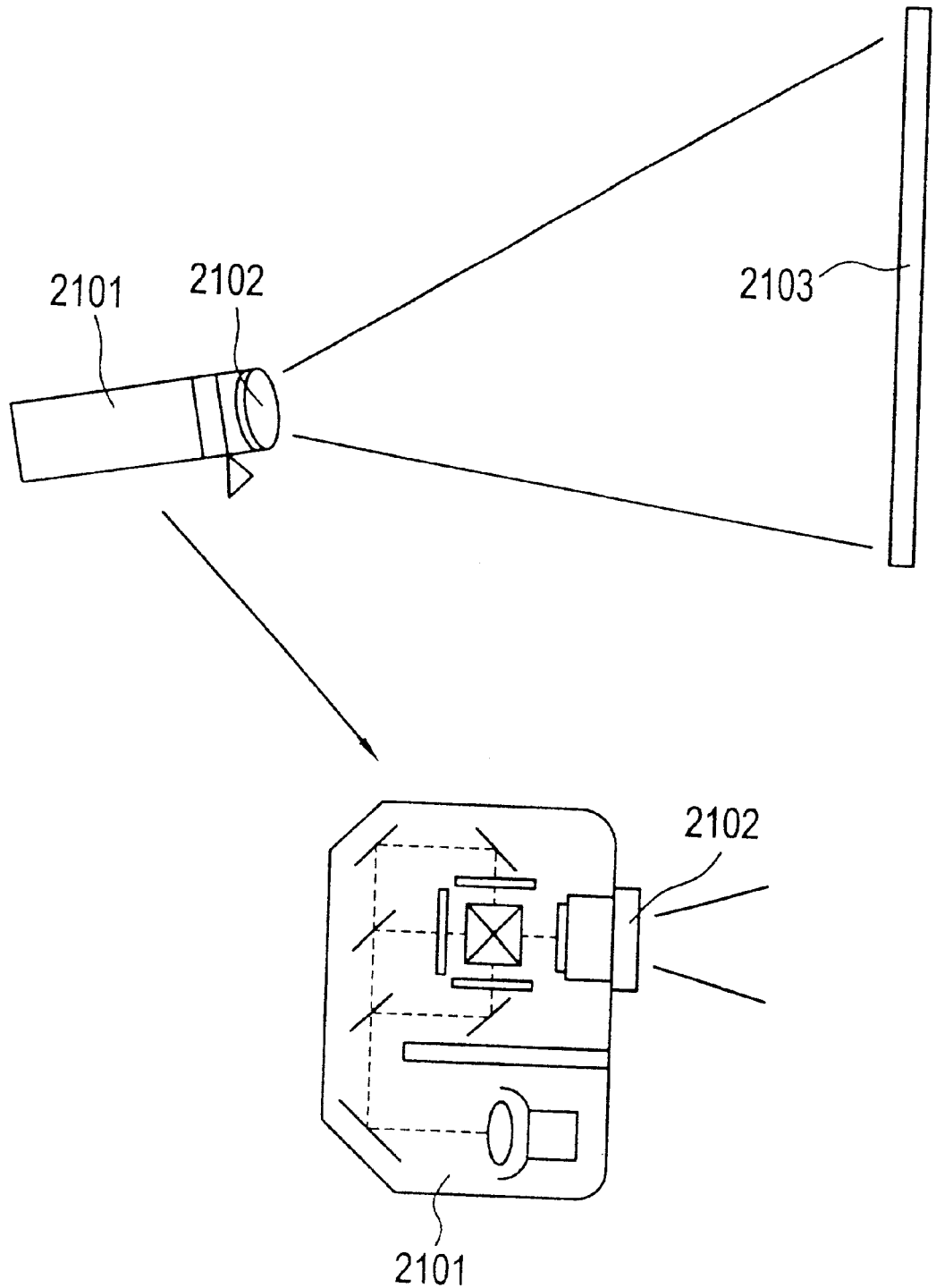
FIG. 21 is a structural diagram showing a front projector having the liquid crystal display device according to the eighth embodiment.

FIG. 21 is a structural diagram showing a front projector according to this embodiment. In FIG. 21, reference numeral 2101 denotes a projector body; 2102 is a projection lens; and 2103 is a screen.

The projector described in the fifth embodiment is used in the projector body 2101. A light including image information is supplied from the projector body 2101, and the image is projected onto the screen 2103 by the projection lens 2102.

The most significant feature of the front type projector resides in that an image is displayed onto a large screen. Accordingly, its demand is high as application for a conference or presentation. The screens of 100 inches and 200 inches are frequently used.

Likewise, as the front type projector of this embodiment, the three-plate type projector according to the fifth embodiment and the single-plate type projector according to the sixth embodiment can be employed depending on uses.

[Ninth Embodiment]

In this embodiment, a description will be given of a liquid crystal display device using antiferroelectric liquid crystal with a driver circuit of the present invention.

A method of manufacturing an active matrix substrate including the pixel TFTs and the driver TFT used in this embodiment is referred to the third embodiment.

In the liquid crystal display device according to this embodiment, antiferroelectric liquid crystal is used. The antiferroelectric liquid crystal has two orientation states, and when a voltage is applied to the antiferroelectric liquid crystal by the pixel TFTs, the liquid crystal molecules in the first or second orientation state is selectively changed into the second or first stable orientation state. The ratio of the liquid crystal molecules which are in the first or second stable orientation state can be varied according to a value of applied voltage. Accordingly, a half-tone state can be controlled by controlling the applied voltage.

The liquid crystal display device using antiferroelectric liquid crystal according to this embodiment does not cause the deterioration of the driver circuit even when a relatively high voltage is applied thereto since the level shifter and the final-stage invertor according to the present invention are used for the driver circuit.

Also, the liquid crystal display device using, antiferroelectric liquid crystal according to this embodiment is high in response speed and excellent in frequency characteristic in comparison with the liquid crystal display device of the TN mode. Accordingly, an excellent image can be displayed.

[Tenth Embodiment]

In the above third to eighth embodiments, the driver circuit of the present invention is used for the liquid crystal panel that conducts display in the ECB (electric field controlled birefringence) mode. However, the driver circuit of the present invention may be used for a liquid crystal panel that conducts display in an IPS (lateral electric field) mode among the ECB mode, or may be used a liquid crystal panel that conducts display in a mode such as a TN (twist nematic) or an STN (supper twist nematic).

Also, in the above third to eighth embodiments, the transmission type liquid crystal panel was described. However, it is needless to say that the drive circuit having the level shifter and the final-stage invertor according to the present invention may be used for a reflection type liquid crystal panel.

Further, in the above third to ninth embodiments, a case of using liquid crystal as display medium was described.

However, the drive circuit of the present invention can be used also for a mixture layer made of liquid crystal and high polymer, a so-called high-polymer diffusion type liquid crystal display device. In addition, the drive circuit of the present invention may be used for a display device having any other display medium optical characteristics of which can be modified in response to an applied voltage. For example, an electroluminescense element or the like may be employed as the display medium.

As was described above, according to the present invention, even when a relatively high voltage is required for driving a gate signal line, and a power supply for a high-voltage driver is used, the deterioration of a TFT due to hot carriers which is a problem with the conventional example can be prevented, and the margin of a voltage that can be dealt with by the driver is set large, to thereby achieve higher withstand voltage of the driver.

What is claimed is:

1. A display device comprising:
   an insulating substrate;
   a plurality of pixel TFTs formed on the insulating substrate;
   a drive circuit formed on the insulating substrate for driving the plurality of pixel TFTs; and
   a display medium an optical response of which is controlled by the plurality of pixel TFTs;
   wherein the drive circuit comprises:
      three power supplies Vdd1, Vdd2 and Vss; and
      a plurality of CMOS circuits formed on the insulating substrate, each of said plurality of CMOS circuits including:
         an output terminal;
         an input terminal;
         at least one p-channel TFT connected between the power supply Vdd2 and the output terminal; and
         an n-channel TFT having two gate electrodes connected between the output terminal and the Vss; and
   wherein a relation of the Vdd2> the Vdd1> the Vss is satisfied, and
   wherein one of the two gate electrodes of the n-channel TFT which is close to the p-channel TFT is connected to the Vdd1, and the other gate electrode is connected to the input terminal.

2. A device according to claim 1, further comprising a level shifter and an invertor having the CMOS circuit.

3. A device according to claim 1,
   wherein the n-channel TFT having the two gate electrodes is formed on the same semiconductor layer.

4. A device according to claim 1,
   wherein the p-channel TFT includes two gate electrodes.

5. A device according to claim 1,
   wherein the display medium comprises liquid crystal.

6. A device according to claim 5,
   wherein the liquid crystal comprises antiferroelectric liquid crystal.

7. A drive circuit for a display device, comprising:
   two power supplies Vdd and Vss; and
   a plurality of CMOS circuits formed on an insulating substrate, each of said plurality of CMOS circuits including:
      an output terminal;
      an input terminal;
      at least one p-channel enhancement TFT connected between the Vdd and the output terminal;

an n-channel enhancement TFT at least one of a source and a drain of which is connected to the Vss; and an n-channel depletion TFT connected between the other of the source and the drain of the n-channel enhancement TFT and the output terminal;

wherein a relation of the Vdd> the Vss is satisfied, and wherein a gate electrode of the n-channel depletion TFT is connected to a node between the n-channel depletion TFT and the n-channel enhancement TFT.

8. A circuit according to claim 7, further comprising a level shifter and an invertor having the CMOS circuit.

9. A circuit according to claim 7, wherein the n-channel enhancement TFT and the n-channel depletion TFT are formed on the same semiconductor layer.

10. A circuit according to claim 7, further comprising a p-channel enhancement TFT between the p-channel enhancement TFT and the output terminal.

11. A display device, comprising:

an insulating substrate;

a plurality of pixel TFTs formed on the insulating substrate;

a drive circuit for driving the plurality of pixel TFTs; and a liquid crystal layer an optical response of which is controlled by the plurality of pixel TFTs;

wherein the drive circuit comprises:

two power supplies Vdd and Vss; and a plurality of CMOS circuits formed on the insulating substrate, each of said plurality of CMOS circuits including:

an output terminal;

an input terminal;

at least one p-channel enhancement TFT connected between the Vdd and the output terminal;

an n-channel enhancement TFT at least one of a source and a drain of which is connected to the Vss; and an n-channel depletion TFT connected between the other of the source and the drain of the n-channel enhancement TFT and the output terminal; and wherein a relation of the Vdd> the Vss is satisfied, and wherein a gate electrode of the n-channel depletion TFT is connected to a node between the n-channel depletion TFT and the n-channel enhancement TFT.

12. A device according to claim 11, further comprising a level shifter and an invertor having the CMOS circuit.

13. A device according to claim 11, wherein the at least one n-channel enhancement TFT and the n-channel depletion TFT is formed on the same semiconductor layer.

14. A device according to claim 11, further comprising a p-channel enhancement TFT between the p-channel enhancement TFT and the output terminal.

15. A drive circuit for a display device comprising:

three power supplies Vdd1, Vdd2 and Vss;

a low-supply-voltage drive section; and a high-supply-voltage drive section;

wherein a relation of the Vdd2> the Vdd1> the Vss is satisfied;

wherein the high-supply-voltage drive section comprises a plurality of CMOS circuits formed on an insulating substrate, each of said plurality of CMOS circuits including:

an output terminal;

an input terminal;

at least one p-channel TFT connected between the power supply Vdd2 and the output terminal; and an n-channel TFT having two gate electrodes connected between the output terminal and the Vss; and wherein one of the two gate electrodes of the n-channel TFT which is close to the p-channel TFT is connected to the Vdd1, and the other gate electrode is connected to the input terminal, and wherein the Vdd1 is applied to a power supply of the low-supply-voltage drive section.

* * * * *